(12) United States Patent
Sun et al.

(10) Patent No.: US 11,002,441 B2
(45) Date of Patent: May 11, 2021

(54) LEAKAGE PROTECTION CIRCUIT, METHOD AND DRIVE DEVICE

(71) Applicant: Shanghai Bright Power Semiconductor Co., Ltd., Shanghai (CN)

(72) Inventors: Shungen Sun, Shanghai (CN); Weijia Yu, Shanghai (CN)

(73) Assignee: SHANGHAI BRIGHT POWER SEMICONDUCTOR CO., LTD., Shanghai (CN)

(*) Notice: Subject to any disclaimer, the term of this patent is extended or adjusted under 35 U.S.C. 154(b) by 0 days.

(21) Appl. No.: 16/515,939

(22) Filed: Jul. 18, 2019

(65) Prior Publication Data

US 2019/0338936 A1    Nov. 7, 2019

Related U.S. Application Data

(63) Continuation of application No. 15/891,928, filed on Feb. 8, 2018, now abandoned.

(30) Foreign Application Priority Data

Dec. 1, 2017   (CN) .......................... 201711252359.8

(51) Int. Cl.
*H05B 45/37* (2020.01)
*H05B 45/50* (2020.01)
(Continued)

(52) U.S. Cl.
CPC .............. *F21V 25/04* (2013.01); *F21K 9/272* (2016.08); *G01R 31/44* (2013.01); *H05B 45/37* (2020.01); *H05B 45/50* (2020.01); *Y02B 20/30* (2013.01)

(58) Field of Classification Search
CPC ......... H05B 45/37; H05B 45/50; F21V 25/04; F21K 9/272; G01R 31/44
(Continued)

(56) References Cited

U.S. PATENT DOCUMENTS 9,497,821 B2    11/2016 Liu
9,689,536 B2    6/2017 Xiong et al.
(Continued)

FOREIGN PATENT DOCUMENTS

CN    106015996 A    10/2016
WO    WO-2017124845    7/2017

*Primary Examiner* — Amy Cohen Johnson
*Assistant Examiner* — Syed M Kaiser
(74) *Attorney, Agent, or Firm* — Muncy, Geissler, Olds & Lowe, P.C.

(57) ABSTRACT

The present disclosure provides a leakage protection circuit, a method and a drive device. The leakage protection circuit is used for being electrically connected with the power supply line of a load, and may be configured to sample the power supply line at intervals, detect the voltage of the sampled electrical signals to determine whether the voltage of the AC input power is divided, and provide leakage protection based on the determined result. The present disclosure can prevent human from electric shock through sampling the electric signals from the power supply line at intervals and performing voltage detection and comparison to determine whether the voltage of the accessed AC input power is divided, when the voltage of the accessed AC input power is determined to be divided, the power supply line will be controlled in non-conductive state.

16 Claims, 7 Drawing Sheets

(51) Int. Cl.
*F21V 25/04* (2006.01)
*F21K 9/272* (2016.01)
*G01R 31/44* (2020.01)

(58) Field of Classification Search
USPC .......................................................... 361/42
See application file for complete search history.

(56) References Cited

U.S. PATENT DOCUMENTS

| | | | |
|---|---|---|---|
| 9,788,390 B2* | 10/2017 | Park | H05B 45/37 |
| 9,942,955 B2* | 4/2018 | Na | H05B 45/37 |
| 9,980,340 B2* | 5/2018 | Hsia | F21K 9/278 |
| 2007/0146944 A1 | 6/2007 | Zhang et al. | |
| 2009/0321869 A1 | 12/2009 | Fukuoka et al. | |
| 2012/0086345 A1* | 4/2012 | Tran | H04L 12/44 |
| | | | 315/158 |
| 2012/0126738 A1* | 5/2012 | Li | H02P 29/0241 |
| | | | 318/490 |
| 2012/0212145 A1* | 8/2012 | Chan | H05B 45/3725 |
| | | | 315/200 R |
| 2013/0010508 A1* | 1/2013 | Courtel | H02M 1/4225 |
| | | | 363/84 |
| 2013/0165847 A1 | 6/2013 | Scarpaci et al. | |
| 2014/0077724 A1* | 3/2014 | Sawada | H02M 3/156 |
| | | | 315/307 |
| 2014/0126261 A1* | 5/2014 | Newman, Jr. | H02M 7/06 |
| | | | 363/128 |
| 2014/0253032 A1* | 9/2014 | Bruwer | H02M 3/33507 |
| | | | 320/108 |
| 2014/0265900 A1* | 9/2014 | Sadwick | H05B 45/00 |
| | | | 315/200 R |
| 2014/0285939 A1 | 9/2014 | Chen | |
| 2016/0036349 A1* | 2/2016 | Steiner | H05B 47/10 |
| | | | 315/307 |
| 2016/0101278 A1 | 4/2016 | Norris et al. | |
| 2016/0320381 A1* | 11/2016 | Holmes | B01L 3/0217 |
| 2016/0344184 A1* | 11/2016 | Sundara Moorthy | H02J 9/005 |
| 2016/0353543 A1* | 12/2016 | Twaddell | H05B 45/37 |
| 2017/0094746 A1* | 3/2017 | Xiong | F21V 15/015 |
| 2017/0118811 A1* | 4/2017 | Dadashnialehi | H05B 47/19 |
| 2017/0164434 A1* | 6/2017 | Xiong | F21K 9/278 |
| 2017/0311397 A1* | 10/2017 | Hsia | H02M 1/32 |
| 2018/0007758 A1* | 1/2018 | Rucker | H05B 45/10 |
| 2018/0042093 A1* | 2/2018 | Hausman, Jr. | H05B 41/295 |
| 2018/0224074 A1* | 8/2018 | Xiong | F21K 9/275 |
| 2018/0241195 A1* | 8/2018 | Zhang | H05B 6/00 |
| 2018/0324925 A1* | 11/2018 | Lu | H05B 45/00 |
| 2018/0368233 A1* | 12/2018 | Xiong | H05B 45/37 |
| 2019/0098725 A1* | 3/2019 | Sadwick | H05B 45/20 |
| 2019/0215919 A1* | 7/2019 | Fang | H02H 9/048 |
| 2019/0338936 A1* | 11/2019 | Sun | F21V 25/04 |
| 2019/0360643 A1* | 11/2019 | Xiong | F21V 23/006 |

* cited by examiner

LEAKAGE PROTECTION CIRCUIT, METHOD AND DRIVE DEVICE

RELATED APPLICATION

This is a continuation application of U.S. patent application Ser. No. 15/891,928, filed Feb. 8, 2018, which claims the benefit of Chinese patent application No. 201711252359.8, filed Dec. 1, 2017.

TECHNICAL FIELD

The present application relates to the technical field of electronic circuit, and in particular to a leakage protection circuit, a method and a drive device.

BACKGROUND OF THE INVENTION

LED tube lamp has dual-end power supply, when one end cap of an LED tube lamp is inserted into a lamp socket but another is not, an electric shock would happen if user touches the metal or conductive parts of another end cap which is not inserted into the lamp socket.

SUMMARY OF THE INVENTION

In view of the above shortcomings of the prior art, the objective of the present application is to provide a leakage protection circuit, a method and a drive device for solving the problem of electric shock caused by touching the metal or conductive parts of an electric appliance by mistake in man-made operations in the prior art.

In one aspect, the present application provides a leakage protection circuit. The leakage protection circuit is electrically connected with the power supply line of a load, and the circuit may be configured to sample an electrical signals from the power supply line at intervals, detect the voltage of the sampled electrical signals to determine whether the voltage of the AC input power is divided, and provide leakage protection based on the determined result.

In some embodiments, the leakage protection circuit may comprise a detection unit, a sampling unit and a control unit. The detection unit is connected with the power supply line, and may be configured to detect the voltage of the power supply line and output the sampling control signals based on the detected voltage. The sampling unit is connected with the detection unit, and may be configured to sample an electrical signals from the power supply line according to the received sampling control signals. The control unit is connected with the sampling unit, and may be configured to compare the voltage of the sampled electrical signals with a predetermined power-off protection voltage threshold, and provide leakage protection response based on the compared result.

In some embodiments, the detection unit may comprise a limited voltage detection circuit module which is connected with the power supply line and configured to detect the voltage of the power supply line and output a first sampling control signal when the detected voltage falls within a predetermined limited voltage range.

In some embodiments, the detection unit may further comprise a timing circuit module which is connected with the limited voltage detection circuit module and configured to output a second sampling control signal based on the first sampling control signal, wherein a second sampling control signal is effective within a time limit.

In some embodiments, the timing circuit module may be configured to set a detection timing based on the first sampling control signal, and output the second sampling control signal after the detection timing is exceeded.

In some embodiments, the timing circuit module may be configured to output the second sampling control signal within the existence duration of the first sampling control signal.

In some embodiments, the interval may be set based on the change period of the voltage of the power supply line or based on a predetermined duration.

In some embodiments, the control unit may comprise a comparison circuit module and a logic latch circuit module. The comparison circuit module may be configured to compare the voltage of the sampled electrical signal with the predetermined power-off protection voltage threshold and output the compared result. The logic latch circuit module is connected with the comparison circuit module, and may be configured to latch the compared result and output a corresponding latch signal. Wherein, the latch signal is representing the leakage protection control signal generated by leakage protection circuit.

In some embodiments, the control unit may further comprise a switch circuit module which is connected with the logic latch circuit module and configured to control the conductive state or non-conductive state of the power supply line.

In some embodiments, the leakage protection circuit may be configured to stop sampling the power supply line at intervals when the power supply line is controlled to be conductive.

In some embodiments, the leakage protection circuit may be an LED leakage protection circuit. The leakage protection circuit is electrically connected with the power supply line, which provides power for LED load. The LED leakage protection circuit may be configured to output a leakage protection control signal based on the determined result, in order that an LED drive circuit electrically connected with the LED leakage protection circuit gives a corresponding leakage protection response based on the leakage protection control signal.

In another aspect, the present application provides a chip. The chip may comprise multiple pins and a leakage protection circuit. Wherein, at least one pin of the multiple pins is electrically connected with the power supply line of a load. The leakage protection circuit is connected with the pin and may be configured to sample electrical signals from the power supply line at intervals, detect the voltage of the sampled electrical signals to determine whether the voltage of the AC input power is divided, and provide leakage protection response based on the determined result.

In some embodiments, the leakage protection circuit may comprise a detection unit, a sampling unit and a control unit. The detection unit is connected with the power supply line, and may be configured to output the sampling control signals based on the detection of the voltage of the power supply line. The sampling unit is connected with the detection unit, and may be configured to sample an electrical signals from the power supply line based on the received sampling control signals. The control unit is connected with the sampling unit, and may be configured to compare the voltage of the sampled electrical signals with a predetermined power-off protection voltage threshold and provide leakage protection based on the compared result.

In some embodiments, the detection unit may comprise a limited voltage detection circuit module which is connected with the power supply line and configured to detect the voltage of the power supply line and output a first sampling control signal when the detected voltage falls within a predetermined limited voltage range.

In some embodiments, the detection unit may further comprise a timing circuit module which is connected with the limited voltage detection circuit module and configured to output a second sampling control signal based on the first sampling control signal, wherein a second sampling control signal is effective within a time limit.

In some embodiments, the interval may be set based on the change period of the voltage of the power supply line or based on a predetermined duration.

In some embodiments, the control unit may comprise a comparison circuit module and a logic latch circuit module. The comparison circuit module may be configured to compare the voltage of the sampled electrical signal with the predetermined power-off protection voltage threshold and output the compared result. The logic latch circuit module is connected with the comparison circuit module, and may be configured to latch the compared result and output a corresponding latch signal. Wherein, the latch signal is representing the leakage protection control signal generated by the leakage protection circuit.

In some embodiments, the control unit may further comprise a switch circuit module which is connected with the logic latch circuit module and configured to control the conductive state or non-conductive state of the power supply line.

In some embodiments, the leakage protection circuit may be an LED leakage protection circuit, and is electrically connected with the power supply line of an LED load via the pin.

In yet another aspect, the present application provides a drive device. The drive device may comprise a rectifying circuit, a leakage protection circuit and a drive circuit. The rectifying circuit may be configured to rectify the accessed AC and then provide to the power supply line of a load. The leakage protection circuit is connected with the power supply line and may be configured to sample electrical signals from the power supply line at intervals, detect the voltage of the sampled electrical signals to determine whether the voltage of the AC input power is divided, and provide leakage protection response based on the determined result. The drive circuit is connected with the leakage protection circuit and may be configured to control the power supply line to supply power to the load.

In some embodiments, the leakage protection circuit may comprise a detection unit, a sampling unit and a control unit. The detection unit is connected with the power supply line, and may be configured to output the sampling control signals based on the detection of the voltage of the power supply line. The sampling unit is connected with the detection unit, and may be configured to sample an electrical signals from the power supply line based on the received sampling control signals. The control unit is connected with the sampling unit, and may be configured to compare the voltage of the sampled electrical signals with a predetermined power-off protection voltage threshold and provide leakage protection based on the compared result.

In some embodiments, the detection unit may comprise a limited voltage detection circuit module which is connected with the power supply line and configured to detect the voltage of the power supply line and output a first sampling control signal when the detected voltage falls within a predetermined limited voltage range.

In some embodiments, the detection unit may further comprise a timing circuit module which is connected with the limited voltage detection circuit module and configured to output a second sampling control signal based on the first sampling control signal, wherein a second sampling control signal is effective within a time limit.

In some embodiments, the control unit may comprise a comparison circuit module and a logic latch circuit module. The comparison circuit module may be configured to compare the voltage of the sampled electrical signal with the predetermined power-off protection voltage threshold and output the compared result. The logic latch circuit module is connected with the comparison circuit module, and may be configured to latch the compared result and output a corresponding latch signal. Wherein, the latch signal is representing the leakage protection control signal generated by the leakage protection circuit.

In some embodiments, the leakage protection circuit may be configured to output the leakage protection control signal to the drive circuit; and the drive circuit gives a corresponding leakage protection response based on the leakage protection control signal.

In some embodiments, the drive circuit may comprise an enable control unit. The enable control unit may be configured to give a corresponding leakage protection response based on the leakage protection control signal when the leakage protection circuit outputs the leakage protection control signal.

In one aspect, the present application provides a leakage protection method. The leakage protection method may comprise: sampling the power supply line of a load at intervals; detecting the voltage of the sampled electrical signals to determine whether the voltage of the AC input power is divided; and providing leakage protection based on the determined result.

In some embodiments, the manner of sampling the power supply line of a load at intervals may comprise: performing limited voltage detection on the voltage of the power supply line; and acquiring the sampled electrical signals from the power supply line based on the result of limited voltage detection.

In some embodiments, the manner of acquiring the sampled electrical signals from the power supply line based on the result of limited voltage detection may comprise: acquiring the sampled electrical signals from the power supply line after a predetermined detection timing is exceeded and the voltage of the power supply line falls within a predetermined limited voltage range.

In some embodiments, the interval may be set based on the change period of the voltage of the power supply line or based on a predetermined duration.

In some embodiments, the manner of detecting the voltage of the sampled electrical signals to determine whether the voltage of the AC input power is divided may comprise: comparing the voltage of the sampled electrical signals with a predetermined power-off protection voltage threshold, and determining whether the voltage of the AC input power is divided based on the compared result.

In some embodiments, the manner of providing leakage protection based on the determined result may comprise: controlling the power supply line to be conductive when the determined result is that the voltage of the AC input power is not divided; and controlling the power supply line to be non-conductive when the determined result is that the voltage of the AC input power is divided; or controlling the drive circuit to supply power to the load when the determined result is that the voltage of the AC input power is not divided; and controlling the drive circuit to give a leakage protection response when the determined result is that the voltage of the AC input power is divided.

As mentioned above, the leakage protection circuit, the method and the drive device in the present application have the following beneficial effects: through sampling the electric signals from the power supply line at intervals and performing voltage detection and comparison to determine whether the voltage of the accessed AC input power is divided, when the voltage of the accessed AC input power is determined to be divided, the power supply line will be controlled in non-conductive state, thereby prevent human from electric shock.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are employed, and the accompanying drawings (also "figure" and "Fig." herein), of which:

DETAILED DESCRIPTION

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

The implementation of the present application is described below via specific embodiments, and those skilled in the art can easily understand other advantages and effects of the present application through the contents disclosed in the present description.

Figure 1:
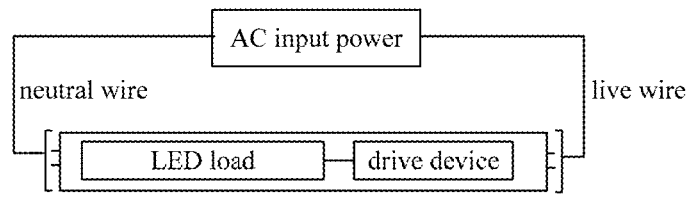
FIG. 1 is a schematic diagram showing the connection relationship when the LED tube lamp is accessed to the AC input power.

Electric leakage caused by man-made operations usually occurs during the assembly operation of loads. With the connection relationship when the LED tube lamp including drive device being connected with AC input power as shown in FIG. 1 as an example, the LED tube lamp is internally provided with a drive device and an LED load, and the two end caps of the LED tube lamp are respectively connected with a lamp sockets (namely, a live wire end and a neutral wire end) of an AC input power. In the assembly process of the above connection relationship, when people insert one end cap of an LED tube lamp into lamp socket, they may concentrate on assembling the needle-shaped pin of the LED tube lamp and neglect the handheld position on the tube lamp, and when one end cap of the tube lamp is inserted onto the lamp socket, they may mistouch the metal or conductive parts of other end cap of the LED tube lamp which is not inserted into the lamp socket, thereby giving rise to the danger of electric shock.

In order to avoid the potential electric leakage existing in the assembly processes of electrical appliances similar to the above assembling connection methods, with the assembling connection methods of the LED tube lamp as an example, the present application provides a leakage protection circuit. The leakage protection circuit is used for being accessed to the power supply line of the load, sampling an electrical signal from the power supply line at intervals, detecting the voltage of the sampled electrical signals to determine whether the voltage of the AC input power is divided or not, and controlling the conductive state of the power supply line based on the determined result. With the LED load as an example, the leakage protection circuit is an LED leakage protection circuit and is configured to provide leakage protection for the user and the LED load when the LED load is connected to the power supply line. The leakage protection circuit provided by the present application can be used as an LED leakage protection circuit and can be connected with the power supply line, which is coupled to the LED load. Wherein the power supply line mainly converts the rectified current into an operating current to drive the load after the AC is rectified, the power supply line is not only provided with a conductor loop which enables the current to be output to the ground wire from the rectifying circuit, but also is provided with an electrical appliance which is arranged on the conductor loop and used for supplying power to the load, wherein the power supply line further includes a leakage protection circuit.

Herein, the leakage protection circuit can be arranged inside the drive device of an electrical appliance, wherein the drive device can perform energy conversion on the AC provided by the AC input power to provide power supply to the load. With the LED drive device as an example, based on the operating voltage of the LED load, the LED drive device provides corresponding power supply to the LED load. The LED leakage protection circuit is arranged inside the LED drive device. For example, the LED leakage protection circuit is arranged in the LED drive device, and is electrically connected with the power supply line which is connected to a rectifying circuit. When the two end caps of an LED tube lamp are not accessed to the AC input power at the same time, the leakage protection circuit enables the whole power supply line to be in non-conductive state in which the load can operate. Within a short time after being accessed to the AC input power, whether electric leakage occurs should be detected, if no electric leakage occurs, then the power supply line is in conductive state in which the load can operate, otherwise, the state in which the power supply line to be in non-conductive state in which the load can operate is maintained.

In the above example, the leakage protection circuit samples the electrical signals from the power supply line at intervals, wherein the power supply line is connected to the rectifying circuit to get the rectified voltage; and detects whether the voltage of the AC input power accessed by the electrical appliance is divided or not based on the voltage of the sampled electrical signals; when the voltage of the AC input power is determined to be divided based on the detection result, leakage protection is provided, thereby effectively preventing the electric leakage danger occurred during unintended touch by human bodies; when the voltage of the AC input power is determined to be not divided based on the detection results, the power supply line is controlled to be in conductive state, thereby realizing providing operating power supply to the load.

Herein, the sampling interval of the leakage protection circuit can be set based on the voltage change period of the power supply line. For example, the electrical signals can be sampled at the voltage peak or the valley in each rectified voltage change period or in at least every rectified voltage change period, or the electrical signals can be sampled in the fixed voltage area between the voltage peak and the valley in each rectified voltage change period or in at least every rectified voltage change period. Wherein in order to ensure that human bodies will not be damaged by continuous electric shock during unintended touch period, the sampling interval is a millisecond or even a microsecond, for example, the sampling interval may be every half of a voltage change period, every one voltage change period or every multiple voltage change periods. The sampling interval can be realized through the circuit structure which is designed by utilizing the voltage change period in the leakage protection circuit. Or, the sampling interval is set according to the predetermined duration. For example, the leakage protection circuit contains a capacitor and a resistor, and the sampling interval is determined based on the charging duration of the capacitor; wherein the technicians can design corresponding sampling intervals through assembling a resistor. The resistor can be an adjustable resistor or a fixed resistor.

Herein, in the voltage detection manner of the leakage protection circuit, the sampled voltage can be compared with the predetermined reference voltage corresponding to the sampling instant to determine whether the voltage of the AC input power is divided or not, so as to determine the conductive or non-conductive state of the power supply line connected to the load. For example, when detecting the voltage of the power supply line is zero, the leakage protection circuit starts the timing of the sampling interval, samples the electrical signals from the power supply line when timing reaches, determines the voltage threshold when timing reaches based on the voltage change period of the power supply line, and compares the voltage of the sampled electrical signals with the voltage threshold to determine whether the voltage of the AC input power is divided or not. When the voltage of the AC input power is determined to be divided, the leakage protection circuit can output the leakage protection control signals to control the other circuits connected with the power supply line to suspend operating or control the power supply line to be in non-conductive state. Wherein the other circuits include but are not limited to a drive circuit and a filter circuit, etc. With the leakage protection circuit of the LED load as an example, the LED leakage protection circuit is used for electrically connecting to the power supply line of the LED load, the LED leakage protection circuit outputs the leakage protection control signals based on the determined compared results, such that the LED drive circuit electrically connected with the LED leakage protection circuit can give corresponding leakage protection response based on the leakage protection control signals. For example, the drive circuit includes an enable control unit, the controlled terminal of the enable control unit is connected with the output terminal of the leakage protection circuit and is connected with the switch device or logic device in the drive circuit, when receiving the leakage protection control signals, the enable control unit controls the switch device in the drive circuit to be non-conductive, such that the energy converted by the drive circuit cannot be provided to the load until the leakage protection control signal is invalid, and the switch device is switched into a conductive state, at this time, the drive circuit can execute the drive operation to provide power for the load. For another example, the drive circuit contains an enable control unit, the controlled terminal of the enable control unit is connected with the output terminal of the leakage protection circuit to receive the leakage protection control signal, the input terminal of the enable control unit is connected with the power supply terminal of the drive circuit, and the output terminal of the enable control unit is grounded; and when the leakage protection circuit outputs the leakage protection control signal, the enable control unit gives corresponding leakage protection response based on the leakage protection control signal, namely, the power supply terminal of the drive circuit is grounded such that the active device in the drive circuit can not reach its operating voltage, that is, the drive circuit can not execute the drive operation to provide power for the load.

Figure 2:
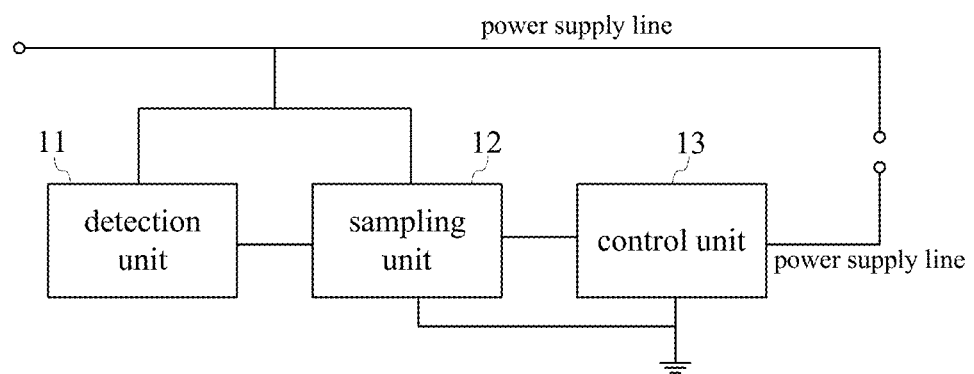
FIG. 2 is a schematic diagram of the structural framework of the leakage protection circuit in one embodiment in the present application.

Herein, the leakage protection circuit samples the voltage of the electrical signals based on the sampling interval set according to the voltage change period, and can determine whether the voltage of the AC input power is divided or not by comparing the voltage of the electrical signals with the predetermined power-off protection voltage threshold. Therefore, please refer to FIG. 2 which is a schematic diagram of the structural framework of the leakage protection circuit in one embodiment. As shown in the figure, the leakage protection circuit includes: a detection unit 11, a sampling unit 12 and a control unit 13.

The detection unit 11 is connected with the power supply line, and is configured to output sampling control signals based on the detection of the voltage of the power supply line. Herein, the detection unit 11 can detect the change of the voltage of the power supply line in real time, and determine to reach the sampling interval when detecting that the voltage changes to the predetermined reference voltage value and output the sampled control signals. Wherein the predetermined reference voltage value can also be equal to any voltage value correspond to the voltage change period, such as the peak value, the valley value and the intermediate value. The sampling unit performs sampling operations based on the sampling control signal.

In some embodiments, the detection unit includes a limited voltage detection circuit module connected with the power supply line, and is configured to detect the voltage of the power supply line, and output the first sampling control signal when the detected voltage falls within the predetermined limited voltage range, wherein the limited voltage range is intercepted in the voltage change range of the power supply line, for example, the limited voltage range is [V1, V2], wherein $0 \le V1 < V2 < Vmax$, and Vmax is the maximum value in the voltage change range.

Figure 3:
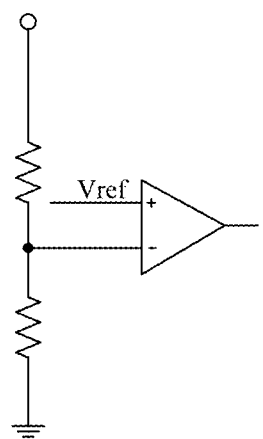
FIG. 3 is a structural schematic diagram of the limited voltage detection circuit module in the leakage protection circuit in the present application in one embodiment.

In order to realize the above limited voltage detection, the limited voltage detection circuit module includes at least one comparator, and the comparator is configured to compare whether the voltage of the power supply line falls in the predetermined limited voltage range, wherein the comparator is configured to provide the boundary threshold of the limited voltage range. The comparator can be a hysteresis comparator, a window comparator or a zero-crossing comparator, etc. In some embodiments, the limited voltage detection circuit module is a valley bottom detection circuit designed based on the sine wave changes. For example, please refer to FIG. 3 which is a structural schematic diagram of the limited voltage detection circuit module. As shown in FIG. 3, the limited voltage detection circuit module includes a zero-crossing comparator, the negative input terminal of the zero-crossing comparator is accessed to the boundary threshold of the limited voltage range, the positive input terminal of the zero-crossing comparator is connected with the power supply line directly or via a circuit containing a sampling resistor, and when the voltage change of the power supply line is smaller than the boundary threshold, the first sampling control signal is output. Wherein the boundary threshold is greater than zero, such that the first sampling control signal maintains for an effective duration, and meanwhile triggering or no triggering by mistake caused by unstable voltage of the power supply line can be tolerated. The sampling unit can sample the electrical signals from the power supply line based on the rising edge or the falling edge of the first sampling control signal, or can continuously sample the electrical signals in the effective duration of the first sampling control signal. The sampling unit can perform the sampling operation once in each voltage change period based on the first sampling control signal.

Figure 4:
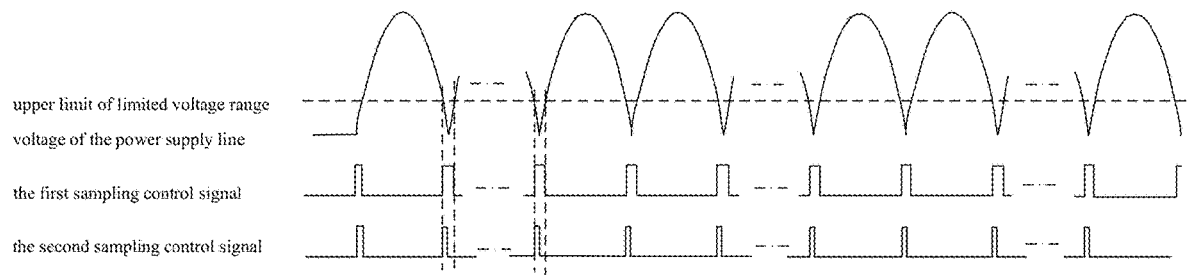
FIG. 4 shows a timing sequence schematic diagram of the limited voltage detection circuit module and the timing circuit module represented by respectively utilizing the waveforms of the first sampling control signal and the second sampling control signal according to the leakage protection circuit in one embodiment in the present application.

In still some other embodiments, the detection unit further includes a timing circuit module. The timing circuit module is connected with the limited voltage detection circuit module and is configured to output a second sampling control signal based on the first sampling control signal, wherein a second sampling control signal is effective within a time limit. The timing circuit module outputs the second sampling control signal when the rising edge of the first sampling control signal is detected, and the sampling unit samples the electrical signals when the second sampling control signal is effective. Wherein, the second sampling control signal is generated from the first sampling control signal, and the second sampling control signal is effective within a time limit, which is preset by the timing circuit based on the effective duration of the first sampling control signal. In addition, the effective duration of the second sampling control signal is deemed as the sampling duration allowed by the sampling unit. The limit of the sampling duration can effectively prevent mis-connectivity operations caused by jittering of the sampled electrical signals. For example, with reference to FIG. 4 which is a timing sequence schematic diagram of the limited voltage detection circuit module and the timing circuit module represented by respectively utilizing the waveforms of the first sampling control signal and the second sampling control signal. The timing circuit module outputs the second sampling control signal when the rising edge of the first sampling control signal is detected, and times the existence duration of the second sampling control signal, in the timing duration, the sampling unit samples the electrical signals. Wherein in order to prevent mis-connectivity operations caused by jittering of the sampled electrical signals, the timing circuit module outputs the second sampling control signal within the existence duration of the first sampling control signal, namely, the existence duration of the second sampling control signal is shorter than the existence duration of the first sampling control signal. The sampling unit samples the electrical signals based on the second sampling control signal.

In some specific examples, the timing circuit module contains a clock signal generator, a counter 1, a logic device group and a switch and the like, wherein the switch is on with the limited voltage detection circuit module, the switch is on with the control terminal of the counter 1, the input terminal of the counter 1 is connected with the clock signal generator, and the output terminal of the counter 1 is connected with the logic device group, wherein the switch is controlled to be on or off based on the first sampling control signal, when the switch is on, the counter 1 begins to count the received clock signals, and before the number of pulses of the clock signals counted by the counter 1 reaches the predetermined value, the logic device group outputs the second sampling control signal; and when the number of pulse signals counted by the counter 1 reaches its count value, the logic device group is controlled not to output the second sampling control signal, until the next first sampling control signal arrives.

Figure 5:
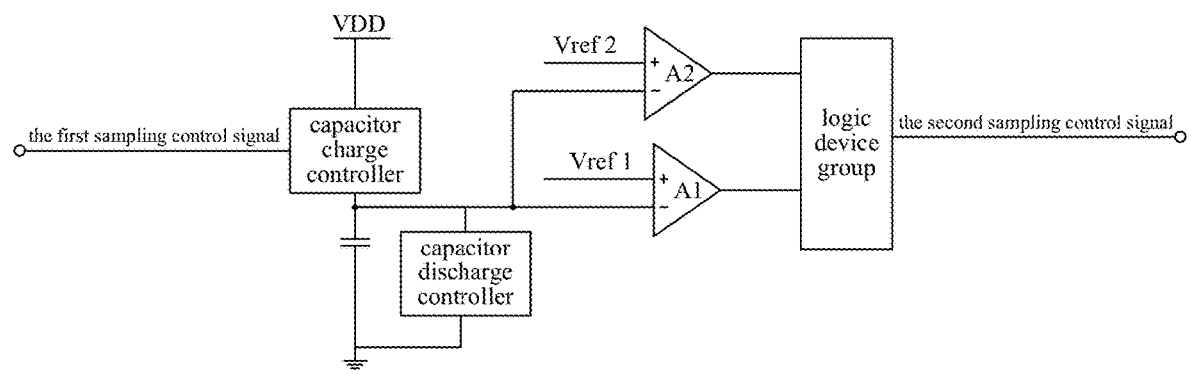
FIG. 5 is a structural schematic diagram of the timing circuit module in one embodiment of the leakage protection circuit in the present application in one embodiment.

In still some specific examples, please refer to FIG. 5 which is a structural schematic diagram of the timing circuit module in one embodiment. As shown in the figure, the timing circuit module contains a capacitor, a capacitor charge controller, a capacitor discharge controller, two comparators, a logic device group and the like, wherein the capacitor discharge controller is connected a capacitor in parallel; the control terminal of the capacitor charge controller receives the first sampling control signal, the input terminal is accessed to a constant voltage, and the output terminal is connected to a capacitor; one end of the capacitor is grounded directly or via a resistor; the another end of capacitor is also connected to the negative input terminal comparators A1 and A2; wherein another positive input terminal of the comparator A1 is accessed to the reference voltage Vref 1, while another positive input terminal of the comparator A2 is accessed to the reference voltage Vref 2; the output terminal of the comparators A1 and A2 are both connected with the logic device group, and the logic device group outputs the second sampling control signal, wherein the capacitor charge controller and the capacitor discharge controller can both be a controlled switch, such as an MOSFET. The reference voltage Vref 1 approaches 0V, while Vref 2 is a voltage value greater than Vref 1. Through the design of the technicians, the duration of the capacitor voltage rising from Vref 1 to Vref 2 is shorter than the existence duration of the first sampling control signal. In the initial period, the capacitor discharge controller is short connected to a capacitor and the capacitor charge controller is disconnected, such that the capacitor is in a zero charge state, correspondingly, the comparator A1 outputs the low level; when the capacitor charge controller receives the first sampling control signal, the capacitor charge controller is conductive and the capacitor discharge controller is non-conductive, such that the capacitor is charged, when the capacitor voltage is higher than the reference voltage Vref 1, the comparator A1 outputs the high level while the comparator A2 still outputs the low level, and when the comparator A1 outputs the high level while the comparator A2 outputs the low level, the logic device group outputs the second sampling control signal based on the predetermined logic configuration; the capacitor continues to be charged, such that when the voltage of the capacitor reaches the Vref 2, the comparator A2 jumps to the high level, and when the comparators A1 and A2 both output the high level, based on the logic configuration, the logic device group will not output the second sampling control signal, and controls the capacitor charge controller to be off so that the capacitor is not charged, and controls the capacitor discharge controller to be on so as to discharge the electric charge of the capacitor, until the next first sampling control signal arrives.

Figure 6:
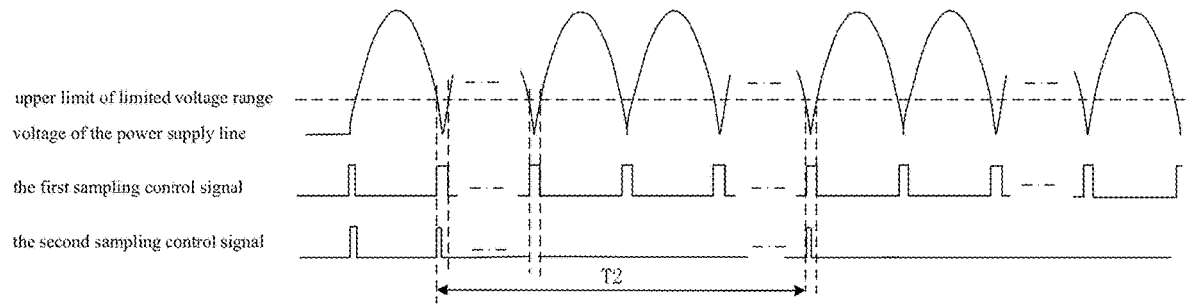
FIG. 6 is a waveform schematic diagram of the relationship between the second sampling control signal output by the timing circuit module and the first sampling control signal in one embodiment of the present application.

In still some other embodiments, the timing circuit module further sets the detection timing based on the first sampling control signal, and outputs the second sampling control signal after the detection timing is exceeded. Please refer to FIG. 6 which is a waveform schematic diagram of the relationship between the second sampling control signal output by the timing circuit module and the first sampling control signal. As shown in the figure, wherein the detection timing can enable that, within at least in one time interval T2 of first sampling control signal, the timing circuit module does not output the second sampling control signal based on the first sampling control signal. Therefore, the existence duration of the detection timing is the minimum time interval of the second sample control signal, and the timing circuit module can output the second sampling control signal in the case that the detection timing is exceeded and the first sampling control signal is effective, that is, the timing circuit module can output the second sampling control signal based on the first sample control signal only if the minimum time interval is satisfied. Further, the sampling interval may be set based on the change period of the voltage of the power supply line or based on a predetermined duration, the minimum time interval also may be set based on the change period of the voltage of the power supply line or based on a predetermined duration.

Based on the technical concept mentioned above, the timing circuit module may further set a sampling interval T3, during which the limited voltage detection circuit module detects a voltage of the power supply line and outputs a first sampling control signal when the detected voltage falls within a predetermined limited voltage range. For example, the timing circuit module is configured to start the sampling interval T3 after T2 is exceeded, instruct the limited voltage detection circuit module to detect the voltage of the power supply line within T3, and output a first sampling control signal when the detected voltage falls within a predetermined limited voltage range. The timing circuit module is configured to output a second sampling control signal based on the received first sampling control signal, and start the time T2 and perform loop operation.

In some specific examples, the timing circuit module contains multiple counters, wherein one counter 1 is used for counting the existence duration of the second sampling control signal, while the other counter 2 is used for counting the detection timing. The timing circuit module further includes a clock signal generator, a switch and a logic device group. The switch is controlled to be on or off based on the first sampling control signal, when the switch is on, the counter 1 begins to count the received clock signals, and before the number of pulses of the clock signals counted by the counter 1 reaches the predetermined value, the logic device group outputs the second sampling control signal; and when the number of pulse signals counted by the counter 1 reaches its count value, the logic device group is controlled not to output the second sampling control signal, at this time, the counter 2 begins to count the number of pulses of the received clock signals; when the counter 2 reaches its count value, namely, the detection timing is exceeded, the logic device group is controlled to output the second sampling control signal.

Figure 7:
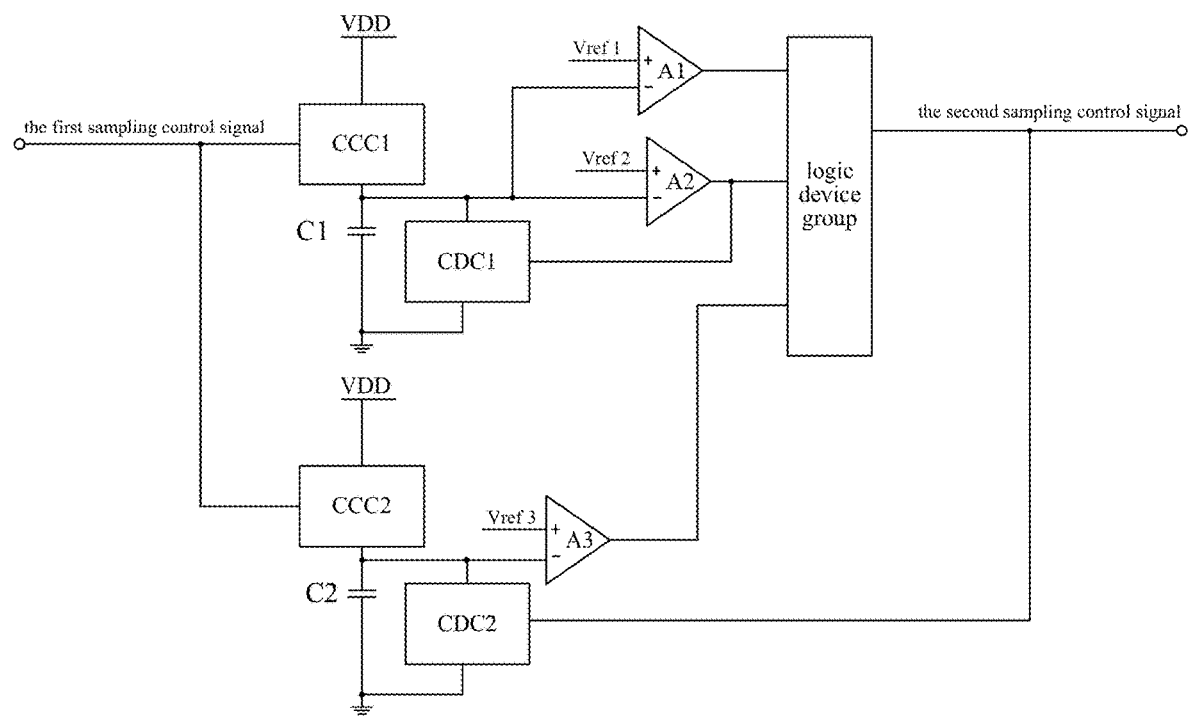
FIG. 7 is a structural schematic diagram of the timing circuit module in another embodiment of the leakage protection circuit of the present application in one embodiment.

In still some other specific examples, please refer to FIG. 7 which is a structural schematic diagram of the timing circuit module in another embodiment. As shown in the figure, the timing circuit module can contain multiple capacitors, and each capacitor is configured with a capacitor charge controller and a capacitor discharge controller, multiple comparators and a logic device group, etc. Wherein the configured capacitor discharge controller is connected to a corresponding capacitor in parallel; the control terminal of the configured capacitor charge controller receives the first sampling control signal, the input terminal is accessed to a constant voltage and the output terminal is connected with a corresponding capacitor; one end of each of the capacitors is grounded directly or via a resistor; another end of the capacitors C1 is further connected with the negative input terminal of the comparators A1 and A2; wherein the positive input terminal of the comparator A1 is accessed to the reference voltage Vref 1, the positive input terminal of the comparator A2 is accessed to the reference voltage Vref 2; the negative input terminal of comparator A3 is connected with another capacitor C2 and the positive input terminal is accessed to the reference voltage Vref 3; the output terminal of the comparators A1, A2 and A3 are all connected with the logic device group, and the logic device group outputs the second sampling control signal, wherein the reference voltage Vref 1 approaches 0V, and Vref 2 is a voltage value greater than Vref 1. Through the design of the technicians, the duration of the voltage of the capacitor C1 rising from Vref 1 to Vref 2 is shorter than the existence duration of the first sampling control signal; and the duration of the voltage of the capacitor C2 from the initial value (such as 0V) to Vref 3 is longer than the existence duration of a first sampling control signal. In the initial period, the capacitor discharge controller CDC1 is short connected to the capacitor C1 and the capacitor charge controller CCC1 is off, such that the capacitor C1 is in a zero charge state, meanwhile, the capacitor discharge controller CDC2 connected with the capacitor C2 is off and the capacitor charge controller CCC2 is on, such that the capacitor C2 is in a charge saving state; correspondingly, the comparators A1 and A2 output the low level while the comparator A3 outputs the high level; when the capacitor charge controller CCC1 connected with the capacitor C1 receives the first sampling control signal, the capacitor charge controller CCC1 connected with the capacitor C1 is on and the capacitor discharge controller CDC1 is off, such that the capacitor C1 is charged. When the voltage of the capacitor C1 is higher than the reference voltage Vref 1, the comparator A1 outputs the high level and the comparator A2 still outputs the low level, and when the comparators A1 and A3 output the high level and the comparator A2 outputs the low level, the logic device group outputs the second sampling control signal based on the predetermined logic configuration; at this time, the capacitor discharge controller CDC2 and the capacitor charge controller CCC2 enable the capacitor C2 to discharge based on the second sampling control signal, and the comparator A3 outputs the low level; however, the capacitor C1 continues to be charged, such that when the voltage reaches Vref 2, the comparator A2 jumps to the high level, and when the comparators A1 and A2 both output the high level and the comparator A3 outputs the low level, based on the logic configuration, the logic device group does not output the second sampling control signal, controls the capacitor charge controller CCC1 to be off such that the capacitor C1 is not charged, and controls the capacitor discharge controller CDC1 to be on to discharge the charge of the capacitor C1. When the capacitor C1 is discharged, the capacitor charge controller CCC2 of the capacitor C2 is on and the capacitor discharge controller CDC2 is off such that the capacitor C2 is charged, until the voltage of the capacitor C2 reaches Vref 3, then the comparator A3 outputs the high level, and when the comparator A3 outputs the high level, based on the logic configuration, the logic device group outputs the second sampling control signal based on the change of the level of the comparators A1 and A2.

It should be noted that, the circuit structure of the timing circuit module mentioned above is only exemplary, rather than limiting the circuit structure of the timing circuit module in the present application. In fact, based on the design of the timing logic by the technicians, other timing circuit modules including a comparator, a logic device group and a capacitor can also be proposed; or, the timing circuit module containing a clock signal generator and a counter can also be proposed, which are not elaborated herein, however, the timing circuit module designed based on the technical enlightment of the above timing circuit module should be deemed as the specific example of the present application. In addition, the devices in the above timing circuit module can be included in the leakage protection circuit. To facilitate the periods of various ACs provided by different AC input powers, the devices used for timing, such as a capacitor and the peripheral devices or a counter, in the timing circuit module can be selected by the technicians based on the requirements of specific designs. Based on the design of the above timing circuit modules, one example is as follows: the sampling unit included in the leakage protection circuit samples the voltage of the electrical signals from the power supply line during the period in which the second sampling control signal is received.

It should also be noted that, as required by actual logic design, the logic device group mentioned in any of the above examples can contain at least one logic device, and all the logic devices are electrically connected to realize corresponding logic configuration, wherein the logic devices include but are not limited to an AND gate, an OR gate, a NAND gate, a NOT gate, an encoder, a decoder, a selector, etc.

The sampling unit is connected with the detection unit and is configured to sample the electrical signals from the power supply line based on the received sampling control signals.

Figure 8:
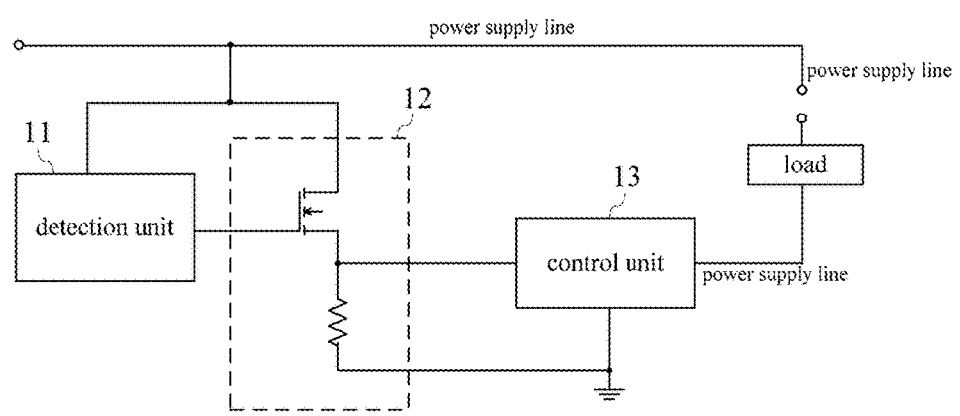
FIG. 8 is a structural schematic diagram of the leakage protection circuit in the present application in one embodiment.

Please refer to FIG. 8 which is a structural schematic diagram of the leakage protection circuit in one embodiment. As shown in the figure, wherein the sampling unit 12 contains a controlled switch and a sampling resistor, wherein the control terminal of the controlled switch is connected with the output terminal of the detection unit, one access terminal of the controlled switch is connected with the power supply line, while the other access terminal is grounded via the sampling resistor, and the sampling resistor is further connected with the control unit 13. Wherein the controlled switch includes but is not limited to any one of a triode (BJT), a junction field effect transistor (JFET), a depletion MOSFET and thyristor. When the detection unit 11 outputs a sampling control signal, the controlled switch is on, and the control unit 13 acquires the voltage of the sampled electrical signals from the sampling resistor.

In one specific example, as shown in FIG. 8, the controlled switch is an MOSFET as an example, the gate of the MOSFET is connected with the output terminal of the detection unit, while the drain of the MOSFET is connected with the power supply line and the source is connected with the sampling resistor. Wherein based on the detection unit described above, the MOSFET is on when receiving the first sampling control signal or the second sampling control signal, such that the control unit 13 acquires the sampled voltage of the electrical signals from the power supply line.

The control unit is configured to compare the voltage of the sampled electrical signals with the predetermined power-off protection voltage threshold and providing leakage protection based on the compared results.

Herein, the power-off protection voltage threshold predetermined by the control unit can be supplied by a constant voltage circuit. The power-off protection voltage threshold can be designed based on the fact that the value of voltage drop of the sampling unit will be influenced by the division of the AC input power by human bodies. When the control unit determines that the sampled voltage is lower than the power-off protection voltage threshold, the power supply line may be controlled to be in non-conductive state or the leakage protection control signals may be output; otherwise, the power supply line is in conductive state so as to enable the load to operate normally.

In one embodiment, the control unit contains a comparison circuit module, a logic latch circuit module and a switch circuit module, wherein the comparison circuit module is configured to compare the voltage of the sampled electrical signals with the predetermined power-off protection voltage threshold and output the compared results. The logic latch circuit module is connected with the comparison circuit module and is configured to latch the compared results. The switch circuit module is connected with the logic latch circuit module and is configured to control the conductive state or non-conductive state of the power supply line based on the latch signals.

Figure 9:
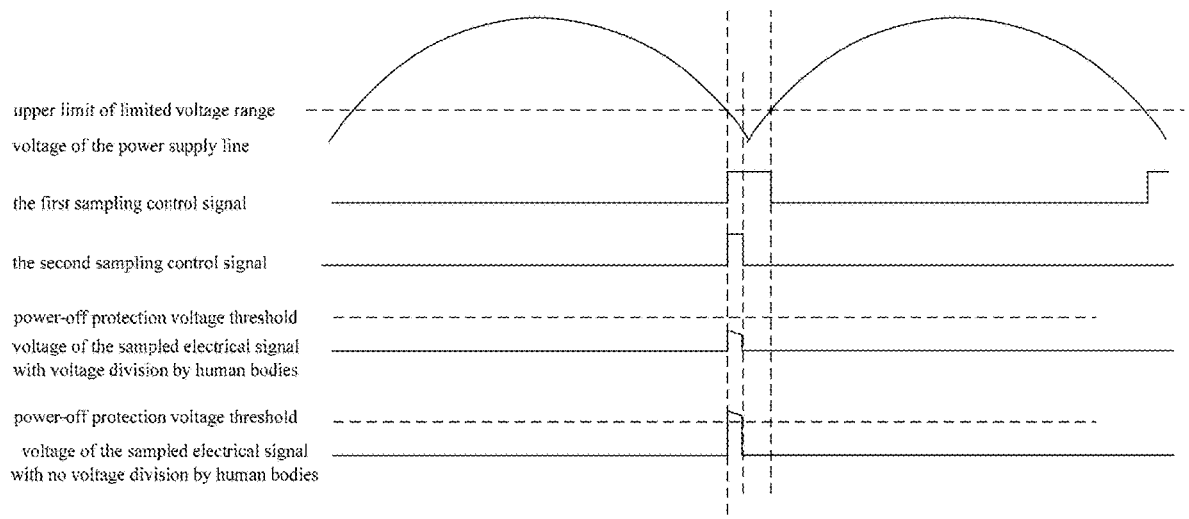
FIG. 9 is a waveform schematic diagram of the relationship between the voltage of the sampled electrical signals and the power-off protection voltage threshold when the leakage protection circuit in the present application detects voltage of AC input power is divided or not.

Please refer to FIG. 9 which shows a waveform schematic diagram of the voltage of sampled electrical signals received by the comparison circuit module when voltage division is generated at the AC input power side due to man-made misoperation and when the load is connected to the power supply line normally with no man-made voltage division, corresponding to the leakage protection circuit as shown in FIG. 8. As shown in the figure, when the load is connected to the power supply line with no man-made misoperation, the sampled voltage is higher than the power-off protection voltage threshold Vref; when the load is connected to the power supply line with man-made misoperation, the sampled voltage is lower than the power-off protection voltage threshold Vref due to voltage division by human bodies. When the sampled voltage is higher than the power-off protection voltage threshold Vref, the comparison circuit module outputs a jumping signal, the logic latch circuit module latches the jumping signal and outputs the latch signal to a switch circuit module, and the switch circuit module controls the power supply line to be in conductive state, otherwise, the comparison circuit module does not output a jumping signal, the logic latch circuit module does not output latch signals, and the switch circuit module maintains the non-conductive state of the power supply line, thereby protecting the safety of the load and human.

In a specific example, the comparison circuit module includes a comparator, and the switch circuit module includes the controlled switch and a switch drive module, the negative input terminal of the comparator is accessed to the power-off protection voltage threshold and the positive input terminal of the comparator is connected to the sampling unit to get the voltage of the sampled electrical signals, the output terminal of the comparator is connected to the input terminal of the logic latch circuit, and the output terminal of the logic latch circuit module is connected to the switch drive module. The switch circuit module includes a gate drive module and an MOSFET as an example, the gate of the MOSFET is connected with the output terminal of the logic latch circuit through the gate drive module, and the source and the drain are connected with the two ends of the power supply line, that is, the MOSFET is a necessary part of the power supply line, the current flow through the MOSFET. When there is no voltage division is generated at the AC input power side, the comparator always outputs the high level, and the MOSFET is turned on and the power supply line is in conductive state such that the load works normally. In another embodiment, the gate of the MOSFET is connected with the output terminal of the comparator through the gate drive module and the like. Please refer to FIG. 10 which is a structural schematic diagram of the leakage protection circuit in another embodiment, wherein the logic latch circuit module latches a high level state when the comparison circuit module outputs the jump signal from a low level to a high level, and latches a low level state when the comparison circuit module outputs the jump signal from a high level to a low level. In the initial period, the logic latch circuit module is in a low level state, and the switch circuit module cuts off the power supply line based on the received latch signals in a low level state; and when the comparison circuit module outputs the jump signal from a low level to a high level, the logic latch circuit module latches the high level state and outputs the latch signals in a high level state, then the switch circuit module is on such that the power supply line is in conductive state. Therefore, it can be seen that the latch signal is representing the leakage protection control signal generated by the leakage protection circuit.

Herein, the MOSFET in the controlled switch can also be substituted into any one of a triode (BJT), a junction field effect transistor (JFET), a depletion MOSFET and a thyristor. The switch drive module is not necessarily a gate drive module, but can be adjusted based on the actual design requirements. For example, the switch circuit module includes an MOSFET and a source drive module, etc.

In some other embodiments, the output terminal of the logic latch circuit module is connected with the other circuits (such as the drive circuit described above) connected with the power supply line, such that the other circuits provide corresponding leakage protection based on the latch signals, and this will not be repeated redundantly herein.

It should be noted that, the comparative relationship between the voltage of the sampled electrical signal with voltage division by human bodies and the power-off protection voltage threshold and the comparative relationship between the sampled electrical signal voltage with no voltage division by human bodies and the power-off protection voltage threshold as shown in the above FIG. 9 are related to the circuit structure of the sampling unit. When the circuit structure of the sampling unit is configured in such a way that the voltage of the sampled electrical signals with voltage division by human bodies is higher than the voltage of the sampled electrical signals with no voltage division by human bodies, the corresponding control unit should provide corresponding leakage protection based on the compared results contrary to those shown in FIG. 9. Wherein the circuit structure of the sampling unit can also be of a connection manner in which one access terminal of the controlled switch is connected to the power supply line via a sampling resistor while the other access terminal of the controlled switch is grounded, and the connection manners will not be enumerated herein.

In order to prevent the logic latch circuit module from providing wrong latch signals in the restarting operation after users turn off the electrical appliance, when the power supply for the load is interrupted, the logic latch circuit module needs to reset to the initial low level state. In some specific examples, the logic latch circuit module resets based on the fact that the leakage protection circuit is in an undervoltage state.

Wherein the undervoltage state is a state in which the voltage of the load cannot reach its normal working voltage due to the influence of external factors or electrical appliance components connected with or located on the power supply line in the normal operating period of the load, such that the load is in a state of not operating. The undervoltage state of the leakage protection circuit is caused by man-made power failure or by abnormity of the electrical appliance components inside (or outside) the leakage protection circuit. For example, the instances enabling the leakage protection circuit to be in an undervoltage state include but are not limited to the power-off state of the leakage protection circuit in the power off period and the state of the leakage protection circuit when the power supply system cannot provide corresponding operating voltage to the active device in the leakage protection circuit.

The logic circuit module can reset the latched signals through detecting the undervoltage state of the leakage protection circuit. In one specific example, the reset terminal of the logic latch circuit module is connected with a power supply line, when the power supply of the power supply line is interrupted, the leakage protection circuit is in an undervoltage state, and the reset terminal of the logic circuit module receives effective reset signals. In another specific example, the reset terminal of the logic latch circuit module is connected with the undervoltage protection circuit used for protecting the leakage protection circuit, and when the undervoltage protection circuit generates undervoltage protection signals due to the detection of an undervoltage state of the leakage protection circuit, the reset terminal of the logic latch circuit module takes the undervoltage protection signal as the effective reset signal, thereby realizing the reset operation of the logic latch circuit module.

In addition, due to the logic latch circuit module, when the power supply line is in conductive state, the detection unit and the sampling unit are not necessarily required to continuously provide voltage of the electrical signals to continuously control the on or off state of the switch circuit unit. Therefore, the sampling of the power supply line at intervals is stopped when the power supply line is controlled to be conductive. Wherein the leakage protection circuit can add a control circuit module in the detection unit or a sampling unit to correspondingly stop the detection or sampling. In some specific examples, the control unit is also connected with the detection unit, and is configured to control the detection unit to stop outputting the sampling control signals while control the power supply line to be conductive. For example, the timing circuit module in the detection unit is further connected with the output terminal of the logic latch circuit module in the control unit, and when the logic latch circuit module outputs the latch signals in a high level state, the timing circuit module does not output the first sampling control signal or the second sampling control signal, thereby effectively preventing such problems as mis-power-off of the load caused by unstable voltage of the AC input power.

Figure 10:
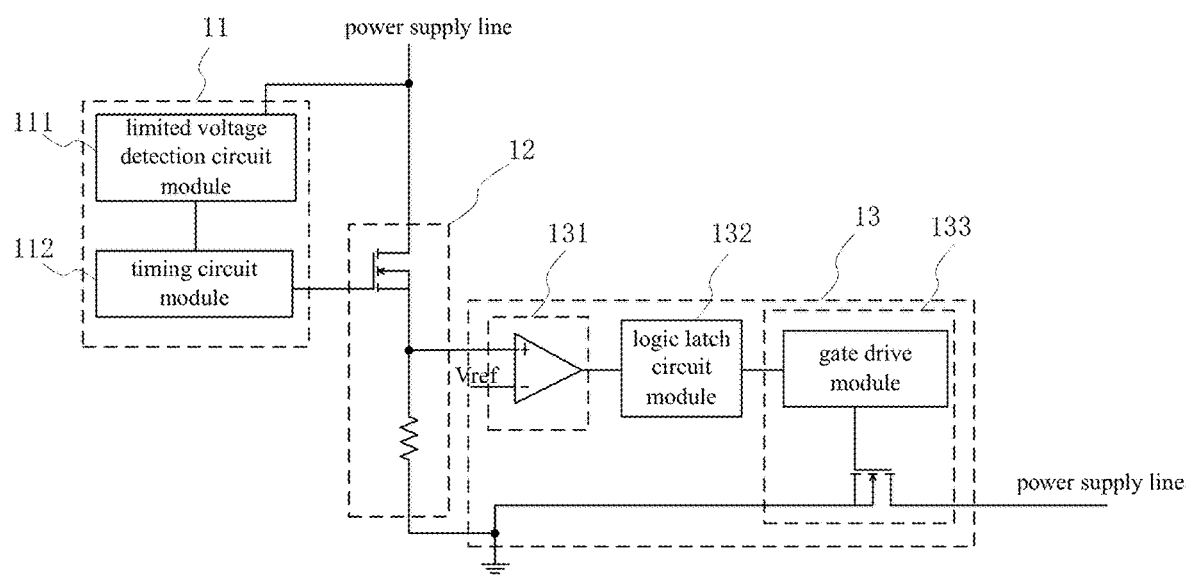
FIG. 10 is a structural schematic diagram of the leakage protection circuit in the present application in another embodiment.

Now, the leakage protection circuit structure as shown in FIG. 10 is taken as an example to describe the operating process of the leakage protection circuit. When the load is connected with the power supply line, the limited voltage detection circuit module 111 acquires the voltage of the power supply line in real time and outputs the first sampling control signal when the acquired voltage falls within the predetermined limited voltage range; and the timing circuit module 112 outputs the second sampling control signal based on the first sampling control signal and begins to time the detection timing, wherein the existence duration of the second sampling control signal is shorter than that of the first sampling control signal, the sampling unit 12 samples the electrical signal from the power supply line based on the second sampling control signal and provides the voltage of the electrical signals to the comparison circuit module 131 included in the control unit 13 to compare the voltage of the electrical signals with the predetermined power-off protection voltage threshold, if the voltage of the electrical signals is lower than the power-off protection voltage threshold, it indicates that the voltage of the AC input power is divided in a man-made manner, the comparison circuit module 131 outputs a low level signal, and the logic latch circuit module 132 controls the switch circuit module 133 to cut off the power supply line based on the low level signal; if the voltage of the electrical signals is higher than the power-off protection voltage threshold, it indicates that the voltage of the AC input power is not divided, the comparison circuit module 131 outputs a high level signal, and the logic latch circuit module 132 outputs the latch signal in a high level state based on the high level signal and controls the switch circuit module 133 to control the power supply line in conductive state.

When the power supply line is in non-conductive state, when the detection timing is not exceeded, the timing circuit module 112 does not output the second sampling control signal based on the first sampling control signal, and until detection timing is exceeded, output the second sampling control signal responds to the first sampling control signal. In addition, when the power supply line is in conductive state, the timing circuit module 112 is controlled not to output the second sampling control signal so as to disconnect the loop in which the sampling resistor is located, thereby reducing the power consumption of the leakage protection circuit.

The present application further provides a chip containing the leakage protection circuit, and the chip can be assembled in a power supply line which supplies power to the load. In some examples, the chip is assembled in a drive device. For example, the chip is assembled in a rear terminal of the rectifying circuit in the drive device. The drive device is an LED drive device as an example.

Figure 11:
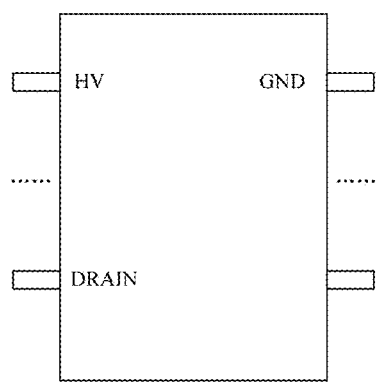
FIG. 11 is a schematic diagram of a packaging structure of the chip containing the leakage protection circuit of the present application in one embodiment.

Please refer to FIG. 11 which is a schematic diagram of a packaging structure of the chip containing the leakage protection circuit. As shown in the figure, the chip contains multiple pins, wherein at least one pin is used for being accessed to the power supply line of the load such that the power supply line via the chip. The pins include GND, DRAIN and HV pins. Wherein the HV pin serves as a current input terminal of the chip and is connected to the power supply line, the DRAIN and GND pins serve as the ground wire loop of the power supply line and are accessed to the power supply line such that the power supply line via the chip. The leakage protection circuit samples the electrical signals from the power supply line at intervals through detecting the HV pin, detects the voltage of the sampled electrical signals so as to determine whether the voltage of the AC input power is divided or not, and controls the conductive or non-conductive state of the circuit between the DRAIN and GND pins based on the determined results, thereby realizing leakage protection. The quantity of the pins of the chip is related to the integrated circuit module, for example, the chip contains the leakage protection circuit, the constant-voltage power supply used by the leakage protection circuit can be shared with the constant-voltage power supply in other circuits in the drive device or can be singly configured and integrated in the chip. For the instance of sharing a constant-voltage power supply, the chip further includes a pin used for connecting with the constant-voltage power supply.

Inside the chip as shown in FIG. 11, the HV, DRAIN and GND pins are all connected with the leakage protection circuit, wherein the HV pin is used for providing the voltage of the power supply line to the leakage protection circuit, and the DRAIN and GND pins are used for connecting or disconnecting the power supply line under the control of the leakage protection circuit. The leakage protection circuit is configured to sample the power supply line at intervals, determine whether the voltage of the AC input power is divided or not based on the detection of the voltage of the sampled electrical signals, and control the conductive state or non-conductive state of the power supply line based on the determined result.

In some other embodiments, based on the actual design requirements of the peripheral circuit of the chip and other circuits in the drive device in which the chip is located, the chip can further include a pin used for outputting the leakage protection control signal and a pin used for connecting the power supply line. Wherein the leakage protection control signal is generated and output when the leakage protection circuit confirms electric leakage through sampling at intervals and voltage division detection. Through the pin used for outputting the leakage protection control signal, other circuits connected with the power supply line can give corresponding leakage protection response based on the received leakage protection control signals. Wherein the other circuits include but are not limited to a filter circuit and a drive circuit, etc. For example, please refer to FIG. 16 which shows a structural schematic diagram of the leakage protection circuit and the drive circuit. The leakage protection circuit 41 is connected with the power supply line and is grounded via the pin of the chip; the drive chip 42 includes an enable control unit (not shown in the figure), the controlled terminal (namely, the enable terminal EN) is connected with the output terminal of the leakage protection circuit 41 via another pin of the chip and is connected with the switch device or the logic circuit (not shown in the figure) in the drive circuit 42, the enable control unit controls the corresponding switch device or the logical circuit when receiving the leakage protection control signal, such that the drive circuit stops providing power supply to the load until the leakage protection control signal is invalid, and provides power supply to the load, at this time, the drive circuit 42 can execute the drive operation. For another example, please refer to FIG. 17 which shows another structural schematic diagram of the leakage protection circuit and the drive circuit, the leakage protection circuit 51 is connected with the power supply line and is grounded via the pin of the chip; the drive circuit 52 contains an enable control unit and an existing drive controller, the controlled terminal of the enable control unit is connected with the output terminal of the leakage protection circuit via another pin of the chip, the input terminal is connected with the power supply terminal of the drive controller, and the output terminal is grounded; and when the leakage protection circuit 51 outputs the leakage protection control signal, the enable control unit gives corresponding leakage protection response based on the leakage protection control signal, that is, make the power supply terminal VCC of the drive controller be grounded, such that the existing drive controller cannot reach its normal operating voltage.

Herein, the sampling interval of the leakage protection circuit can be set based on the voltage change period of the power supply line. For example, the electrical signals can be sampled at the voltage peak or the valley in each rectified voltage change period or in at least every rectified voltage change period, or the electrical signals can be sampled in the fixed voltage area between the voltage peak and the valley in each rectified voltage change period or in at least every rectified voltage change period. Wherein in order to ensure that human bodies will not be damaged by continuous electric shock during unintended touch period, the sampling interval is a millisecond or even a microsecond, for example, the sampling interval may be every half of a voltage change period, every one voltage change period or every multiple voltage change periods. The sampling interval can be realized through the circuit structure which is designed by utilizing the voltage change period in the leakage protection circuit. Or, the sampling interval is set according to the predetermined duration. For example, the leakage protection circuit contains a capacitor and a resistor, and the sampling interval is determined based on the charging duration of the capacitor; wherein the technicians can design corresponding sampling intervals through assembling a resistor. The resistor can be an adjustable resistor or a fixed resistor.

Herein, in the voltage detection manner of the leakage protection circuit, the sampled voltage can be compared with the predetermined reference voltage corresponding to the sampling instant to determine whether the voltage of the AC input power is divided or not, so as to determine the conductive or non-conductive state of the power supply line connected to the load. For example, when detecting the voltage of the power supply line is zero, the leakage protection circuit starts the timing of the sampling interval, samples the electrical signals from the power supply line when timing reaches, determines the voltage threshold when timing reaches based on the voltage change period of the power supply line, and compares the voltage of the sampled electrical signals with the voltage threshold to determine whether the voltage of the AC input power is divided or not. When the voltage of the AC input power is determined to be divided, the leakage protection circuit can output the leakage protection control signals to control the other circuits connected with the power supply line to give corresponding leakage protection response or control the power supply line to be in non-conductive state.

In some embodiments, the leakage protection circuit samples the voltage of the electrical signals based on the sampling interval set according to the voltage change period, and can determine whether the voltage of the AC input power is divided or not by comparing the voltage of the electrical signals with the predetermined power-off protection voltage threshold. Therefore, as shown in the FIG. 2, the leakage protection circuit includes: a detection unit 11, a sampling unit 12 and a control unit 13.

The detection unit 11 is connected with the power supply line via an HV pin, and is configured to output sampling control signals based on the detection of the voltage of the power supply line. Herein, the detection unit 11 can detect the change of the voltage of the power supply line in real time, and determine to reach the sampling interval when detecting that the voltage changes to the predetermined reference voltage value and output the sampled control signals. Wherein the predetermined reference voltage value can also be equal to any voltage value correspond to the voltage change period, such as the peak value, the valley value and the intermediate value. The sampling unit performs sampling operations based on the sampling control signal.

In some embodiments, the detection unit includes a limited voltage detection circuit module connected with the power supply line, and is configured to detect the voltage of the power supply line, and output the first sampling control signal when the detected voltage falls within the predetermined limited voltage range, wherein the limited voltage range is intercepted in the voltage change range of the power supply line, for example, the limited voltage range is [V1, V2], wherein 0≤V1<V2<Vmax, and Vmax is the maximum value in the voltage change range.

In order to realize the above limited voltage detection, the limited voltage detection circuit module includes at least one comparator, and the comparator is configured to compare whether the voltage of the power supply line falls in the predetermined limited voltage range, wherein the comparator is configured to provide the boundary threshold of the limited voltage range. The comparator can be a hysteresis comparator, a window comparator or a zero-crossing comparator, etc. In some embodiments, the limited voltage detection circuit module is a valley bottom detection circuit designed based on the sine wave changes. For example, as shown in FIG. 3, the limited voltage detection circuit module includes a zero-crossing comparator, the negative input terminal of the zero-crossing comparator is accessed to the boundary threshold of the limited voltage range, the positive input terminal of the zero-crossing comparator is connected with the power supply line directly or via a circuit containing a sampling resistor, and when the voltage change of the power supply line is smaller than the boundary threshold, the first sampling control signal is output. Wherein the boundary threshold is greater than zero, such that the first sampling control signal maintains for an effective duration, and meanwhile triggering or no triggering by mistake caused by unstable voltage of the power supply line can be tolerated. The sampling unit can sample the electrical signals from the power supply line based on the rising edge or the falling edge of the first sampling control signal, or can continuously sample the electrical signals in the effective duration of the first sampling control signal. The sampling unit can perform the sampling operation once in each voltage change period based on the first sampling control signal.

In still some other embodiments, the detection unit further includes a timing circuit module. The timing circuit module is connected with the limited voltage detection circuit module and is configured to output a second sampling control signal based on the first sampling control signal, wherein a second sampling control signal is effective within a time limit. The timing circuit module outputs the second sampling control signal when the rising edge of the first sampling control signal is detected, and the sampling unit samples the electrical signals when the second sampling control signal is effective. Wherein, the second sampling control signal is generated from the first sampling control signal, and the second sampling control signal is effective within a time limit, which is preset by the timing circuit based on the effective duration of the first sampling control signal. In addition, the effective duration of the second sampling control signal is deemed as the sampling duration allowed by the sampling unit. The limit of the sampling duration can effectively prevent mis-connectivity operations caused by jittering of the sampled electrical signals. For example, with reference to FIG. 4, the timing circuit module outputs the second sampling control signal when the rising edge of the first sampling control signal is detected, and times the existence duration of the second sampling control signal, in the timing duration, the sampling unit samples the electrical signals. Wherein in order to prevent mis-connectivity operations caused by jittering of the sampled electrical signals, the timing circuit module outputs the second sampling control signal within the existence duration of the first sampling control signal, namely, the existence duration of the second sampling control signal is shorter than the existence duration of the first sampling control signal. The sampling unit samples the electrical signals based on the second sampling control signal.

In some specific examples, the timing circuit module contains a clock signal generator, a counter 1, a logic device group and a switch and the like, wherein the switch is on with the limited voltage detection circuit module, the switch is on with the control terminal of the counter 1, the input terminal of the counter 1 is connected with the clock signal generator, and the output terminal of the counter 1 is connected with the logic device group, wherein the switch is controlled to be on or off based on the first sampling control signal, when the switch is on, the counter 1 begins to count the received clock signals, and before the number of pulses of the clock signals counted by the counter 1 reaches the predetermined value, the logic device group outputs the second sampling control signal; and when the number of pulse signals counted by the counter 1 reaches its count value, the logic device group is controlled not to output the second sampling control signal, until the next first sampling control signal arrives.

In still some specific examples, as shown in the FIG. 5, the timing circuit module contains a capacitor, a capacitor charge controller, a capacitor discharge controller, two comparators, a logic device group and the like, wherein the capacitor discharge controller is connected a capacitor in parallel; the control terminal of the capacitor charge controller receives the first sampling control signal, the input terminal is accessed to a constant voltage, and the output terminal is connected to a capacitor; one end of the capacitor is grounded directly or via a resistor; the another end of capacitor is also connected to the negative input terminal comparators A1 and A2; wherein another positive input terminal of the comparator A1 is accessed to the reference voltage Vref 1, while another positive input terminal of the comparator A2 is accessed to the reference voltage Vref 2; the output terminal of the comparators A1 and A2 are both connected with the logic device group, and the logic device group outputs the second sampling control signal, wherein the capacitor charge controller and the capacitor discharge controller can both be a controlled switch, such as an MOSFET. The reference voltage Vref 1 approaches 0V, while Vref 2 is a voltage value greater than Vref 1. Through the design of the technicians, the duration of the capacitor voltage rising from Vref 1 to Vref 2 is shorter than the existence duration of the first sampling control signal. In the initial period, the capacitor discharge controller is short connected to a capacitor and the capacitor charge controller is disconnected, such that the capacitor is in a zero charge state, correspondingly, the comparator A1 outputs the low level; when the capacitor charge controller receives the first sampling control signal, the capacitor charge controller is conductive and the capacitor discharge controller is non-conductive, such that the capacitor is charged, when the capacitor voltage is higher than the reference voltage Vref 1, the comparator A1 outputs the high level while the comparator A2 still outputs the low level, and when the comparator A1 outputs the high level while the comparator A2 outputs the low level, the logic device group outputs the second sampling control signal based on the predetermined logic configuration; the capacitor continues to be charged, such that when the voltage of the capacitor reaches the Vref 2, the comparator A2 jumps to the high level, and when the comparators A1 and A2 both output the high level, based on the logic configuration, the logic device group will not output the second sampling control signal, and controls the capacitor charge controller to be off so that the capacitor is not charged, and controls the capacitor discharge controller to be on so as to discharge the electric charge of the capacitor, until the next first sampling control signal arrives.

In some embodiments, the timing circuit module further sets the detection timing based on the first sampling control signal, and outputs the second sampling control signal after the detection timing is exceeded. Please refer to FIG. 6 which is a waveform schematic diagram of the relationship between the second sampling control signal output by the timing circuit module and the first sampling control signal. As shown in the figure, wherein the detection timing can enable that, within at least in one time interval T2 of first sampling control signal, the timing circuit module does not output the second sampling control signal based on the first sampling control signal. Therefore, the existence duration of the detection timing is the minimum time interval of the second sample control signal, and the timing circuit module can output the second sampling control signal in the case that the detection timing is exceeded and the first sampling control signal is effective, that is, the timing circuit module can output the second sampling control signal based on the first sample control signal only if the minimum time interval is satisfied. Further, the sampling interval may be set based on the change period of the voltage of the power supply line or based on a predetermined duration, the minimum time interval also may be set based on the change period of the voltage of the power supply line or based on a predetermined duration.

Based on the technical concept mentioned above, the timing circuit module may further set a sampling interval T3, during which the limited voltage detection circuit module detects a voltage of the power supply line and outputs a first sampling control signal when the detected voltage falls within a predetermined limited voltage range. For example, the timing circuit module is configured to start the sampling interval T3 after T2 is exceeded, instruct the limited voltage detection circuit module to detect the voltage of the power supply line within T3, and output a first sampling control signal when the detected voltage falls within a predetermined limited voltage range. The timing circuit module is configured to output a second sampling control signal based on the received first sampling control signal, and start the time T2 and perform loop operation.

In some specific examples, the timing circuit module contains multiple counters, wherein one counter 1 is used for counting the existence duration of the second sampling control signal, while the other counter 2 is used for counting the detection timing. The timing circuit module further includes a clock signal generator, a switch and a logic device group. The switch is controlled to be on or off based on the first sampling control signal, when the switch is on, the counter 1 begins to count the received clock signals, and before the number of pulses of the clock signals counted by the counter 1 reaches the predetermined value, the logic device group outputs the second sampling control signal; and when the number of pulse signals counted by the counter 1 reaches its count value, the logic device group is controlled not to output the second sampling control signal, at this time, the counter 2 begins to count the number of pulses of the received clock signals; when the counter 2 reaches its count value, namely, the detection timing is exceeded, the logic device group is controlled to output the second sampling control signal.

In still some other specific examples, as shown in the FIG. 7, the timing circuit module can contain multiple capacitors, and each capacitor is configured with a capacitor charge controller and a capacitor discharge controller, multiple comparators and a logic device group, etc. Wherein the configured capacitor discharge controller is connected to a corresponding capacitor in parallel; the control terminal of the configured capacitor charge controller receives the first sampling control signal, the input terminal is accessed to a constant voltage and the output terminal is connected with a corresponding capacitor; one end of each of the capacitors is grounded directly or via a resistor; another end of the capacitors C1 is further connected with the negative input terminal of the comparators A1 and A2; wherein the positive input terminal of the comparator A1 is accessed to the reference voltage Vref 1, the positive input terminal of the comparator A2 is accessed to the reference voltage Vref 2; the negative input terminal of comparator A3 is connected with another capacitor C2 and the positive input terminal is accessed to the reference voltage Vref 3; the output terminal of the comparators A1, A2 and A3 are all connected with the logic device group, and the logic device group outputs the second sampling control signal, wherein the reference voltage Vref 1 approaches 0V, and Vref 2 is a voltage value greater than Vref 1. Through the design of the technicians, the duration of the voltage of the capacitor C1 rising from Vref 1 to Vref 2 is shorter than the existence duration of the first sampling control signal; and the duration of the voltage of the capacitor C2 from the initial value (such as 0V) to Vref 3 is longer than the existence duration of a first sampling control signal. In the initial period, the capacitor discharge controller CDC1 is short connected to the capacitor C1 and the capacitor charge controller CCC1 is off, such that the capacitor C1 is in a zero charge state, meanwhile, the capacitor discharge controller CDC2 connected with the capacitor C2 is off and the capacitor charge controller CCC2 is on, such that the capacitor C2 is in a charge saving state; correspondingly, the comparators A1 and A2 output the low level while the comparator A3 outputs the high level; when the capacitor charge controller CCC1 connected with the capacitor C1 receives the first sampling control signal, the capacitor charge controller CCC1 connected with the capacitor C1 is on and the capacitor discharge controller CDC1 is off, such that the capacitor C1 is charged. When the voltage of the capacitor C1 is higher than the reference voltage Vref 1, the comparator A1 outputs the high level and the comparator A2 still outputs the low level, and when the comparators A1 and A3 output the high level and the comparator A2 outputs the low level, the logic device group outputs the second sampling control signal based on the predetermined logic configuration; at this time, the capacitor discharge controller CDC2 and the capacitor charge controller CCC2 enable the capacitor C2 to discharge based on the second sampling control signal, and the comparator A3 outputs the low level; however, the capacitor C1 continues to be charged, such that when the voltage reaches Vref 2, the comparator A2 jumps to the high level, and when the comparators A1 and A2 both output the high level and the comparator A3 outputs the low level, based on the logic configuration, the logic device group does not output the second sampling control signal, controls the capacitor charge controller CCC1 to be off such that the capacitor C1 is not charged, and controls the capacitor discharge controller CDC1 to be on to discharge the charge of the capacitor C1. When the capacitor C1 is discharged, the capacitor charge controller CCC2 of the capacitor C2 is on and the capacitor discharge controller CDC2 is off such that the capacitor C2 is charged, until the voltage of the capacitor C2 reaches Vref 3, then the comparator A3 outputs the high level, and when the comparator A3 outputs the high level, based on the logic configuration, the logic device group outputs the second sampling control signal based on the change of the level of the comparators A1 and A2.

It should be noted that, the circuit structure of the timing circuit module mentioned above is only exemplary, rather than limiting the circuit structure of the timing circuit module in the present application. In fact, based on the design of the timing logic by the technicians, other timing circuit modules including a comparator, a logic device group and a capacitor can also be proposed; or, the timing circuit module containing a clock signal generator and a counter can also be proposed, which are not elaborated herein, however, the timing circuit module designed based on the technical enlightment of the above timing circuit module should be deemed as the specific example of the present application. In addition, the devices in the above timing circuit module can be included in the chip. To facilitate the periods of various ACs provided by different AC input powers, the devices used for timing, such as a capacitor and the peripheral devices or a counter, in the timing circuit module can be assembled outside the chip, and the devices can be controlled to acquire data through corresponding pins, such that the technicians can select based on the requirements of specific designs. Based on the design of the above timing circuit modules, one example is as follows: the sampling unit included in the leakage protection circuit samples the voltage of the electrical signals from the power supply line during the period in which the second sampling control signal is received.

It should also be noted that, as required by actual logic design, the logic device group mentioned in any of the above examples can contain at least one logic device, and all the logic devices are electrically connected to realize corresponding logic configuration, wherein the logic devices include but are not limited to an AND gate, an OR gate, a NAND gate, a NOT gate, an encoder, a decoder, a selector, etc.

The sampling unit is connected with the detection unit and is configured to sample the electrical signals from the power supply line based on the received sampling control signals.

Please refer to FIG. 8 which is a structural schematic diagram of the leakage protection circuit in one embodiment. As shown in the figure, wherein the sampling unit 12 contains a controlled switch and a sampling resistor, wherein the control terminal of the controlled switch is connected with the output terminal of the detection unit, one access terminal of the controlled switch is connected with the power supply line via the HV pin, while the other access terminal is grounded (namely, connected to the GND pin) via the sampling resistor, and the sampling resistor is further connected with the control unit 13. Wherein the controlled switch includes but is not limited to any one of a triode (BJT), a junction field effect transistor (JFET), a depletion MOSFET and thyristor. When the detection unit 11 outputs a sampling control signal, the controlled switch is on, and the control unit 13 acquires the voltage of the sampled electrical signals from the sampling resistor.

In one specific example, as shown in FIG. 8, the controlled switch is an MOSFET as an example, the gate of the MOSFET is connected with the output terminal of the detection unit, while the drain of the MOSFET is connected with the power supply line and the source is connected with the sampling resistor. Wherein based on the detection unit described above, the MOSFET is on when receiving the first sampling control signal or the second sampling control signal, such that the control unit 13 acquires the sampled voltage of the electrical signals from the power supply line.

The control unit is configured to compare the voltage of the sampled electrical signals with the predetermined power-off protection voltage threshold and providing leakage protection based on the compared results.

Herein, the power-off protection voltage threshold predetermined by the control unit can be supplied by a constant voltage circuit. The power-off protection voltage threshold can be designed based on the fact that the value of voltage drop of the sampling unit will be influenced by the division of the AC input power by human bodies. When the control unit determines that the sampled voltage is lower than the power-off protection voltage threshold, the power supply line may be controlled to be in non-conductive state or the leakage protection control signals may be output; otherwise, the power supply line is in conductive state so as to enable the load to operate normally.

In one embodiment, the control unit contains a comparison circuit module, a logic latch circuit module and a switch circuit module, wherein the comparison circuit module is configured to compare the voltage of the sampled electrical signals with the predetermined power-off protection voltage threshold and output the compared results. The logic latch circuit module is connected with the comparison circuit module and is configured to latch the compared results. The switch circuit module is connected with the logic latch circuit module and is configured to control the conductive state or non-conductive state of the power supply line based on the latch signals.

Please refer to FIG. 9 which shows a waveform schematic diagram of the voltage of sampled electrical signals received by the comparison circuit module when voltage division is generated at the AC input power side due to man-made misoperation and when the load is connected to the power supply line normally with no man-made voltage division, corresponding to the leakage protection circuit as shown in FIG. 8. As shown in the figure, when the load is connected to the power supply line with no man-made misoperation, the sampled voltage is higher than the power-off protection voltage threshold Vref; when the load is connected to the power supply line with man-made misoperation, the sampled voltage is lower than the power-off protection voltage threshold Vref due to voltage division by human bodies. When the sampled voltage is higher than the power-off protection voltage threshold Vref, the comparison circuit module outputs a jumping signal, the logic latch circuit module latches the jumping signal and outputs the latch signal to a switch circuit module, and the switch circuit module controls the power supply line to be in conductive state, otherwise, the comparison circuit module does not output a jumping signal, the logic latch circuit module does not output latch signals, and the switch circuit module maintains the non-conductive state of the power supply line, thereby protecting the safety of the load and human.

In a specific example, the comparison circuit module includes a comparator, and the switch circuit module includes the controlled switch and a switch drive module, the negative input terminal of the comparator is accessed to the power-off protection voltage threshold and the positive input terminal of the comparator is connected to the sampling unit to get the voltage of the sampled electrical signals, the output terminal of the comparator is connected to the input terminal of the logic latch circuit, and the output terminal of the logic latch circuit module is connected to the switch drive module. The switch circuit module includes a gate drive module and an MOSFET as an example, the gate of the MOSFET is connected with the output terminal of the logic latch circuit through the gate drive module, and the source and the drain are connected with the two ends of the power supply line, that is, the MOSFET is a necessary part of the power supply line, the current flow through the MOSFET. When there is no voltage division is generated at the AC input power side, the comparator always outputs the high level, and the MOSFET is turned on and the power supply line is in conductive state such that the load works normally. In another embodiment, the gate of the MOSFET is connected with the output terminal of the comparator through the gate drive module and the like. Please refer to FIG. 10 which is a structural schematic diagram of the leakage protection circuit in another embodiment, wherein the logic latch circuit module latches a high level state when the comparison circuit module outputs the jump signal from a low level to a high level, and latches a low level state when the comparison circuit module outputs the jump signal from a high level to a low level. In the initial period, the logic latch circuit module is in a low level state, and the switch circuit module cuts off the power supply line based on the received latch signals in a low level state; and when the comparison circuit module outputs the jump signal from a low level to a high level, the logic latch circuit module latches the high level state and outputs the latch signals in a high level state, then the switch circuit module is on such that the power supply line is in conductive state. Therefore, it can be seen that the latch signal is representing the leakage protection control signal generated by the leakage protection circuit.

Herein, the MOSFET in the controlled switch can also be substituted into any one of a triode (BJT), a junction field effect transistor (JFET), a depletion MOSFET and a thyristor. The switch drive module is not necessarily a gate drive module, but can be adjusted based on the actual design requirements. For example, the switch circuit module includes an MOSFET and a source drive module, etc.

In some other embodiments, the output terminal of the logic latch circuit module is connected with the other circuits (such as the drive circuit described above) connected with the power supply line, such that the other circuits provide corresponding leakage protection based on the latch signals, and this will not be repeated redundantly herein.

It should be noted that, the comparative relationship between the voltage of the sampled electrical signal with voltage division by human bodies and the power-off protection voltage threshold and the comparative relationship between the sampled electrical signal voltage with no voltage division by human bodies and the power-off protection voltage threshold as shown in the above FIG. 9 are related to the circuit structure of the sampling unit. When the circuit structure of the sampling unit is configured in such a way that the voltage of the sampled electrical signals with voltage division by human bodies is higher than the voltage of the sampled electrical signals with no voltage division by human bodies, the corresponding control unit should provide corresponding leakage protection based on the compared results contrary to those shown in FIG. 9. Wherein the circuit structure of the sampling unit can also be of a connection manner in which one access terminal of the controlled switch is connected to the power supply line via a sampling resistor while the other access terminal of the controlled switch is grounded, and the connection manners will not be enumerated herein.

In order to prevent the logic latch circuit module from providing wrong latch signals in the restarting operation after users turn off the electrical appliance, when the power supply for the load is interrupted, the logic latch circuit module needs to reset to the initial low level state. In some specific examples, the logic latch circuit module resets based on the fact that the leakage protection circuit is in an undervoltage state.

Wherein the undervoltage state is a state in which the voltage of the load cannot reach its normal working voltage due to the influence of external factors or electrical appliance components connected with or located on the power supply line in the normal operating period of the load, such that the load is in a state of not operating. The undervoltage state of the leakage protection circuit is caused by man-made power failure or by abnormity of the electrical appliance components inside (or outside) the leakage protection circuit. For example, the instances enabling the leakage protection circuit to be in an undervoltage state include but are not limited to the power-off state of the leakage protection circuit in the power off period and the state of the leakage protection circuit when the power supply system cannot provide corresponding operating voltage to the active device in the leakage protection circuit.

The logic circuit module can reset the latched signals through detecting the undervoltage state of the leakage protection circuit. In one specific example, the reset terminal of the logic latch circuit module is connected with a power supply line, when the power supply of the power supply line is interrupted, the leakage protection circuit is in an undervoltage state, and the reset terminal of the logic circuit module receives effective reset signals. In another specific example, the reset terminal of the logic latch circuit module is connected with the undervoltage protection circuit used for protecting the leakage protection circuit, and when the undervoltage protection circuit generates undervoltage protection signals due to the detection of an undervoltage state of the leakage protection circuit, the reset terminal of the logic latch circuit module takes the undervoltage protection signal as the effective reset signal, thereby realizing the reset operation of the logic latch circuit module.

In addition, due to the logic latch circuit module, when the power supply line is in conductive state, the detection unit and the sampling unit are not necessarily required to continuously provide voltage of the electrical signals to continuously control the on or off state of the switch circuit unit. Therefore, the sampling of the power supply line at intervals is stopped when the power supply line is controlled to be conductive. Wherein the leakage protection circuit can add a control circuit module in the detection unit or a sampling unit to correspondingly stop the detection or sampling. In some specific examples, the control unit is also connected with the detection unit, and is configured to control the detection unit to stop outputting the sampling control signals while control the power supply line to be conductive. For example, the timing circuit module in the detection unit is further connected with the output terminal of the logic latch circuit module in the control unit, and when the logic latch circuit module outputs the latch signals in a high level state, the timing circuit module does not output the first sampling control signal or the second sampling control signal, thereby effectively preventing such problems as mis-power-off of the load caused by unstable voltage of the AC input power.

Now, the leakage protection circuit structure shown in FIG. 10 and the chip packaging structure shown in FIG. 11 are taken as an example to describe the operating process of the chip. When the load is connected with a power supply line, the HV pin is electrically connected with the power supply line, the limited voltage detection circuit module 111 connected with the HV pin and inside the chip can acquire the voltage of the power supply line in real time and outputs the first sampling control signal when the acquired voltage falls within the predetermined limited voltage range; and the timing circuit module 112 outputs the second sampling control signal based on the first sampling control signal and begins to time the detection timing, wherein the existence duration of the second sampling control signal is shorter than that of the first sampling control signal, the sampling unit 12 samples the electrical signal from the power supply line based on the second sampling control signal and provides the voltage of the electrical signals to the comparison circuit module 131 included in the control unit 13 to compare the voltage of the electrical signals with the predetermined power-off protection voltage threshold, if the voltage of the electrical signals is lower than the power-off protection voltage threshold, it indicates that the voltage of the AC input power is divided in a man-made manner, the comparison circuit module 131 outputs a low level signal, and the logic latch circuit module 132 controls the switch circuit module to cut off the power supply line based on the low level signal; if the voltage of the electrical signals is higher than the power-off protection voltage threshold, it indicates that no man-made electric shock occurs, the comparison circuit module 131 outputs a high level signal, and the logic latch circuit module 132 outputs the latch signal in a high level state based on the high level signal and controls the switch circuit module 133 to be communicated with DRAIN pin and the GND pin, such that the power supply line in conductive state.

When the power supply line is in non-conductive state, when the detection timing is not exceeded, the timing circuit module 112 does not output the second sampling control signal based on the first sampling control signal, and until detection timing is exceeded, output the second sampling control signal responds to the first sampling control signal. In addition, when the power supply line is in conductive state, the timing circuit module 112 is controlled not to output the second sampling control signal so as to disconnect the loop in which the sampling resistor is located, thereby reducing the power consumption of the leakage protection circuit.

The present application further provides a drive device. The drive device is configured to provide DC power supply higher than body safety voltage to the load. With the LED load as an example, as an LED drive device, the drive device is configured to drive the LED load to operate normally. Herein, the LED load takes the LED tube lamp as an example, when the LED tube lamp is installed, people may touch the needle-shaped pin due to misoperation, when the needle-shaped pin is connected with the LED drive device at the same time, human bodies will be damaged by electric shock. To this end, a leakage protection circuit is assembled in the LED drive device. The drive device provided by the present application can be used as an LED drive device and can be assembled in the AC input power and provide a power supply line to the LED load.

Figure 12:
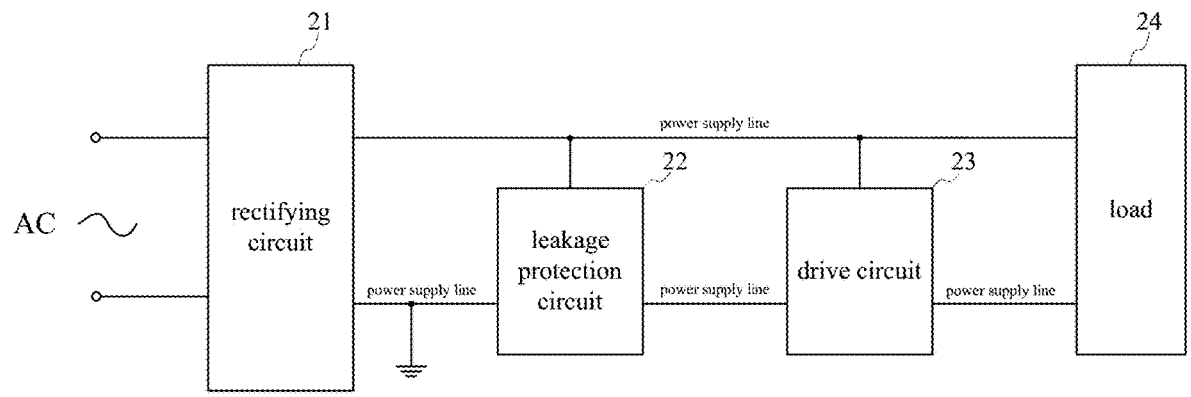
FIG. 12 is a frame structural schematic diagram of the drive device in the present application in one embodiment.

FIG. 12 shows a frame structural schematic diagram of a drive device. As shown in the figure, the drive device includes a rectifying circuit 21, a leakage protection circuit 22 and a drive circuit 23. The drive device is configured to supply the DC power supply higher than the body safety voltage to the load 24. Wherein with the LED load as an example, the drive device is an LED drive device and provides leakage protection to the user and the LED load when the LED load is connected to the power supply line. The drive device provides leakage protection when detecting the voltage division generated by man-made misoperation and maintain the power supply line in conductive state and provides power supply to the LED load when detecting no man-made misoperation.

The rectifying circuit 21 is configured to rectify the accessed AC and provide the rectified voltage to the power supply line of the load. Herein, the rectifying circuit 21 is accessed to the AC input power and is subjected to rectified output via a rectifier bridge constituted by four diodes.

The leakage protection circuit 22 is connected to the rectifying circuit 21 and is configured to sample the power supply line at intervals, detect the voltage of the sampled electrical signals to determine whether the voltage of the AC input power is divided, and provide leakage protection based on the determined results.

As shown in FIG. 12, the leakage protection circuit 22 is coupled to rectifying circuit 21. The leakage protection circuit can be integrated into a chip. In some embodiments, as shown in FIG. 11, the HV pin of the chip is connected with the output of the rectifier circuit, the GND pin is connected with the grounded end of the rectifier bridge, and the DRAIN pin of the chip is connected onto the loop of the power supply line of the load. Therefore, the conductive or non-conductive state of the grounded part in the power supply line of the load is controlled by the leakage protection circuit, namely, when the leakage protection circuit detects that the voltage of the AC input power is divided, the power supply line is cut off, otherwise, the power supply line is in conductive state. The quantity of the pins of the chip is related to the integrated circuit module. For example, the chip contains the leakage protection circuit, the constant voltage power supply used by the leakage protection circuit can be shared by other circuits in the drive device or can be singly assembled and integrated in a chip. For the instance of sharing a constant voltage power supply, the chip further includes a pin used for connecting the constant voltage power supply.

In some other embodiments, based on the actual design requirements of the peripheral circuit of the chip and other circuits in the drive device in which the chip is located, the chip can further include a pin used for outputting the leakage protection control signal and a pin used for connecting the power supply line. Wherein the leakage protection control signal is generated and output when the leakage protection circuit confirms electric leakage through sampling at intervals and voltage division detection. Through the pin used for outputting the leakage protection control signal, other circuits connected with the power supply line can give corresponding leakage protection response based on the received leakage protection control signals. Wherein the other circuits include but are not limited to a filter circuit and a drive circuit, etc. For example, please refer to FIG. 16 which shows a structural schematic diagram of the leakage protection circuit and the drive circuit. The leakage protection circuit 41 is connected with the power supply line and is grounded via the pin of the chip; the drive chip 42 includes an enable control unit (not shown in the figure), the controlled terminal (namely, the enable terminal EN) is connected with the output terminal of the leakage protection circuit 41 via another pin of the chip, and the enable control unit controls the switch device or the logic circuit (not shown in the figure) in the drive circuit 42, the enable control unit controls the switch device or the logical circuit in the drive circuit 42 when receiving the leakage protection control signal, such that the energy converted by the drive circuit 42 can not be provided to the load until the leakage protection control signal is invalid, and the switch device is switched into a conductive state, at this time, the drive circuit 42 can execute the drive operation. For another example, please refer to FIG. 17 which shows another structural schematic diagram of the leakage protection circuit and the drive circuit, the leakage protection circuit 51 is connected with the power supply line and is grounded via the pin of the chip; the drive circuit 52 contains an enable control unit and an existing circuit in the drive controller, the controlled terminal of the enable control unit is connected with the output terminal of the leakage protection circuit via another pin of the chip, the input terminal is connected with the power supply terminal of the drive chip, and the output terminal is grounded; and when the leakage protection circuit 51 outputs the leakage protection control signal, the enable control unit gives corresponding leakage protection response based on the leakage protection control signal, that is, make the power supply terminal VCC of the drive controller be grounded, such that the active device in the circuit in existing drive controller cannot reach its normal operating voltage.

Herein, the sampling interval of the leakage protection circuit can be set based on the voltage change period of the power supply line. The sampling interval can be realized through the circuit structure in the detection unit configured to control the sampling interval in the leakage protection circuit. For example, the electrical signals can be sampled at the voltage peak or the valley in each rectified voltage change period or in at least every rectified voltage change period, or the electrical signals can be sampled in the fixed voltage area between the voltage peak and the valley in each rectified voltage change period or in at least every rectified voltage change period. Wherein in order to ensure that human bodies will not be damaged by continuous electric shock during unintended touch period, the sampling interval is a millisecond or even a microsecond, for example, the sampling interval may be every half of a voltage change period, every one voltage change period or every multiple voltage change periods. The sampling interval can be realized through the circuit structure which is designed by utilizing the voltage change period in the leakage protection circuit. Or, the sampling interval is set according to the predetermined duration. For example, the leakage protection circuit contains a capacitor and a resistor, and the sampling interval is determined based on the charging duration of the capacitor; wherein the technicians can design corresponding sampling intervals through assembling a resistor. The resistor can be an adjustable resistor or a fixed resistor.

Herein, in the voltage detection manner of the leakage protection circuit, the sampled voltage can be compared with the predetermined reference voltage corresponding to the sampling instant to determine whether the voltage of the AC input power is divided or not, so as to determine the conductive or non-conductive state of the power supply line connected to the load. For example, when detecting the voltage of the power supply line is zero, the leakage protection circuit starts the timing of the sampling interval, samples the electrical signals from the power supply line when timing reaches, determines the voltage threshold when timing reaches based on the voltage change period of the power supply line, and compares the voltage of the sampled electrical signals with the voltage threshold to determine whether the voltage of the AC input power is divided or not. When the voltage of the AC input power is determined to be divided, the leakage protection circuit can output the leakage protection control signals to control the other circuits connected with the power supply line to give corresponding leakage protection response or control the power supply line to be in non-conductive state.

In some embodiments, the leakage protection circuit samples the voltage of the electrical signals based on the sampling interval set according to the voltage change period, and can determine whether the voltage of the AC input power is divided or not by comparing the voltage of the electrical signals with the predetermined power-off protection voltage threshold. Therefore, as shown in the FIG. 2, the leakage protection circuit includes: a detection unit 11, a sampling unit 12 and a control unit 13.

The detection unit 11 is connected with the power supply line, and is configured to output sampling control signals based on the detection of the voltage of the power supply line. Herein, the detection unit 11 can detect the change of the voltage of the power supply line in real time, and determine to reach the sampling interval when detecting that the voltage changes to the predetermined reference voltage value and output the sampled control signals. Wherein the predetermined reference voltage value can also be equal to any voltage value correspond to the voltage change period, such as the peak value, the valley value and the intermediate value. The sampling unit performs sampling operations based on the sampling control signal.

In some embodiments, the detection unit includes a limited voltage detection circuit module connected with the power supply line, and is configured to detect the voltage of the power supply line, and output the first sampling control signal when the detected voltage falls within the predetermined limited voltage range, wherein the limited voltage range is intercepted in the voltage change range of the power supply line, for example, the limited voltage range is [V1, V2], wherein 0≤V1<V2<Vmax, and Vmax is the maximum value in the voltage change range.

In order to realize the above limited voltage detection, the limited voltage detection circuit module includes at least one comparator, and the comparator is configured to compare whether the voltage of the power supply line falls in the predetermined limited voltage range, wherein the comparator is configured to provide the boundary threshold of the limited voltage range. The comparator can be a hysteresis comparator, a window comparator or a zero-crossing comparator, etc. In some embodiments, the limited voltage detection circuit module is a valley bottom detection circuit designed based on the sine wave changes. For example, as shown in FIG. 3, the limited voltage detection circuit module includes a zero-crossing comparator, the negative input terminal of the zero-crossing comparator is accessed to the boundary threshold of the limited voltage range, the positive input terminal of the zero-crossing comparator is connected with the power supply line directly or via a circuit containing a sampling resistor, and when the voltage change of the power supply line is smaller than the boundary threshold, the first sampling control signal is output. Wherein the boundary threshold is greater than zero, such that the first sampling control signal maintains for an effective duration, and meanwhile triggering or no triggering by mistake caused by unstable voltage of the power supply line can be tolerated. The sampling unit can sample the electrical signals from the power supply line based on the rising edge or the falling edge of the first sampling control signal, or can continuously sample the electrical signals in the effective duration of the first sampling control signal. The sampling unit can perform the sampling operation once in each voltage change period based on the first sampling control signal.

In still some other embodiments, the detection unit further includes a timing circuit module. The timing circuit module is connected with the limited voltage detection circuit module and is configured to output a second sampling control signal based on the first sampling control signal, wherein a second sampling control signal is effective within a time limit. The timing circuit module outputs the second sampling control signal when the rising edge of the first sampling control signal is detected, and the sampling unit samples the electrical signals when the second sampling control signal is effective. Wherein, the second sampling control signal is generated from the first sampling control signal, and the second sampling control signal is effective within a time limit, which is preset by the timing circuit based on the effective duration of the first sampling control signal. In addition, the effective duration of the second sampling control signal is deemed as the sampling duration allowed by the sampling unit. The limit of the sampling duration can effectively prevent mis-connectivity operations caused by jittering of the sampled electrical signals. For example, with reference to FIG. 4 which is a timing sequence schematic diagram of the limited voltage detection circuit module and the timing circuit module represented by respectively utilizing the waveforms of the first sampling control signal and the second sampling control signal, the timing circuit module outputs the second sampling control signal when the rising edge of the first sampling control signal is detected, and times the existence duration of the second sampling control signal, in the timing duration, the sampling unit samples the electrical signals. Wherein in order to prevent mis-connectivity operations caused by jittering of the sampled electrical signals, the timing circuit module outputs the second sampling control signal within the existence duration of the first sampling control signal, namely, the existence duration of the second sampling control signal is shorter than the existence duration of the first sampling control signal. The sampling unit samples the electrical signals based on the second sampling control signal.

In some specific examples, the timing circuit module contains a clock signal generator, a counter 1, a logic device group and a switch and the like, wherein the switch is on with the limited voltage detection circuit module, the switch is on with the control terminal of the counter 1, the input terminal of the counter 1 is connected with the clock signal generator, and the output terminal of the counter 1 is connected with the logic device group, wherein the switch is controlled to be on or off based on the first sampling control signal, when the switch is on, the counter 1 begins to count the received clock signals, and before the number of pulses of the clock signals counted by the counter 1 reaches the predetermined value, the logic device group outputs the second sampling control signal; and when the number of pulse signals counted by the counter 1 reaches its count value, the logic device group is controlled not to output the second sampling control signal, until the next first sampling control signal arrives.

In still some specific examples, as shown in the FIG. 5, the timing circuit module contains a capacitor, a capacitor charge controller, a capacitor discharge controller, two comparators, a logic device group and the like, wherein the capacitor discharge controller is connected a capacitor in parallel; the control terminal of the capacitor charge controller receives the first sampling control signal, the input terminal is accessed to a constant voltage, and the output terminal is connected to a capacitor; one end of the capacitor is grounded directly or via a resistor; the another end of capacitor is also connected to the negative input terminal comparators A1 and A2; wherein another positive input terminal of the comparator A1 is accessed to the reference voltage Vref 1, while another positive input terminal of the comparator A2 is accessed to the reference voltage Vref 2; the output terminal of the comparators A1 and A2 are both connected with the logic device group, and the logic device group outputs the second sampling control signal, wherein the capacitor charge controller and the capacitor discharge controller can both be a controlled switch, such as an MOSFET. The reference voltage Vref 1 approaches 0V, while Vref 2 is a voltage value greater than Vref 1. Through the design of the technicians, the duration of the capacitor voltage rising from Vref 1 to Vref 2 is shorter than the existence duration of the first sampling control signal. In the initial period, the capacitor discharge controller is short connected to a capacitor and the capacitor charge controller is disconnected, such that the capacitor is in a zero charge state, correspondingly, the comparator A1 outputs the low level; when the capacitor charge controller receives the first sampling control signal, the capacitor charge controller is conductive and the capacitor discharge controller is non-conductive, such that the capacitor is charged, when the capacitor voltage is higher than the reference voltage Vref 1, the comparator A1 outputs the high level while the comparator A2 still outputs the low level, and when the comparator A1 outputs the high level while the comparator A2 outputs the low level, the logic device group outputs the second sampling control signal based on the predetermined logic configuration; the capacitor continues to be charged, such that when the voltage of the capacitor reaches the Vref 2, the comparator A2 jumps to the high level, and when the comparators A1 and A2 both output the high level, based on the logic configuration, the logic device group will not output the second sampling control signal, and controls the capacitor charge controller to be off so that the capacitor is not charged, and controls the capacitor discharge controller to be on so as to discharge the electric charge of the capacitor, until the next first sampling control signal arrives.

In still some other embodiments, the timing circuit module further sets the detection timing based on the first sampling control signal, and outputs the second sampling control signal after the detection timing is exceeded. Please refer to FIG. 6 which is a waveform schematic diagram of the relationship between the second sampling control signal output by the timing circuit module and the first sampling control signal. As shown in the figure, wherein the detection timing can enable that, within at least in one time interval T2 of first sampling control signal, the timing circuit module does not output the second sampling control signal based on the first sampling control signal. Therefore, the existence duration of the detection timing is the minimum time interval of the second sample control signal, and the timing circuit module can output the second sampling control signal in the case that the detection timing is exceeded and the first sampling control signal is effective, that is, the timing circuit module can output the second sampling control signal based on the first sample control signal only if the minimum time interval is satisfied. Further, the sampling interval may be set based on the change period of the voltage of the power supply line or based on a predetermined duration, the minimum time interval also may be set based on the change period of the voltage of the power supply line or based on a predetermined duration.

Based on the technical concept mentioned above, the timing circuit module may further set a sampling interval T3, during which the limited voltage detection circuit module detects a voltage of the power supply line and outputs a first sampling control signal when the detected voltage falls within a predetermined limited voltage range. For example, the timing circuit module is configured to start the sampling interval T3 after T2 is exceeded, instruct the limited voltage detection circuit module to detect the voltage of the power supply line within T3, and output a first sampling control signal when the detected voltage falls within a predetermined limited voltage range. The timing circuit module is configured to output a second sampling control signal based on the received first sampling control signal, and start the time T2 and perform loop operation.

In some specific examples, the timing circuit module contains multiple counters, wherein one counter 1 is used for counting the existence duration of the second sampling control signal, while the other counter 2 is used for counting the detection timing. The timing circuit module further includes a clock signal generator, a switch and a logic device group. The switch is controlled to be on or off based on the first sampling control signal, when the switch is on, the counter 1 begins to count the received clock signals, and before the number of pulses of the clock signals counted by the counter 1 reaches the predetermined value, the logic device group outputs the second sampling control signal; and when the number of pulse signals counted by the counter 1 reaches its count value, the logic device group is controlled not to output the second sampling control signal, at this time, the counter 2 begins to count the number of pulses of the received clock signals; when the counter 2 reaches its count value, namely, the detection timing is exceeded, the logic device group is controlled to output the second sampling control signal.

In still some other specific examples, please refer to FIG. 7 which is a structural schematic diagram of the timing circuit module in another embodiment. As shown in the figure, the timing circuit module can contain multiple capacitors, and each capacitor is configured with a capacitor charge controller and a capacitor discharge controller, multiple comparators and a logic device group, etc. Wherein the configured capacitor discharge controller is connected to a corresponding capacitor in parallel; the control terminal of the configured capacitor charge controller receives the first sampling control signal, the input terminal is accessed to a constant voltage and the output terminal is connected with a corresponding capacitor; one end of each of the capacitors is grounded directly or via a resistor; another end of the capacitors C1 is further connected with the negative input terminal of the comparators A1 and A2; wherein the positive input terminal of the comparator A1 is accessed to the reference voltage Vref 1, the positive input terminal of the comparator A2 is accessed to the reference voltage Vref 2; the negative input terminal of comparator A3 is connected with another capacitor C2 and the positive input terminal is accessed to the reference voltage Vref 3; the output terminal of the comparators A1, A2 and A3 are all connected with the logic device group, and the logic device group outputs the second sampling control signal, wherein the reference voltage Vref 1 approaches 0V, and Vref 2 is a voltage value greater than Vref 1. Through the design of the technicians, the duration of the voltage of the capacitor C1 rising from Vref 1 to Vref 2 is shorter than the existence duration of the first sampling control signal; and the duration of the voltage of the capacitor C2 from the initial value (such as 0V) to Vref 3 is longer than the existence duration of a first sampling control signal. In the initial period, the capacitor discharge controller CDC1 is short connected to the capacitor C1 and the capacitor charge controller CCC1 is off, such that the capacitor C1 is in a zero charge state, meanwhile, the capacitor discharge controller CDC2 connected with the capacitor C2 is off and the capacitor charge controller CCC2 is on, such that the capacitor C2 is in a charge saving state; correspondingly, the comparators A1 and A2 output the low level while the comparator A3 outputs the high level; when the capacitor charge controller CCC1 connected with the capacitor C1 receives the first sampling control signal, the capacitor charge controller CCC1 connected with the capacitor C1 is on and the capacitor discharge controller CDC1 is off, such that the capacitor C1 is charged. When the voltage of the capacitor C1 is higher than the reference voltage Vref 1, the comparator A1 outputs the high level and the comparator A2 still outputs the low level, and when the comparators A1 and A3 output the high level and the comparator A2 outputs the low level, the logic device group outputs the second sampling control signal based on the predetermined logic configuration; at this time, the capacitor discharge controller CDC2 and the capacitor charge controller CCC2 enable the capacitor C2 to discharge based on the second sampling control signal, and the comparator A3 outputs the low level; however, the capacitor C1 continues to be charged, such that when the voltage reaches Vref 2, the comparator A2 jumps to the high level, and when the comparators A1 and A2 both output the high level and the comparator A3 outputs the low level, based on the logic configuration, the logic device group does not output the second sampling control signal, controls the capacitor charge controller CCC1 to be off such that the capacitor C1 is not charged, and controls the capacitor discharge controller CDC1 to be on to discharge the charge of the capacitor C1. When the capacitor C1 is discharged, the capacitor charge controller CCC2 of the capacitor C2 is on and the capacitor discharge controller CDC2 is off such that the capacitor C2 is charged, until the voltage of the capacitor C2 reaches Vref 3, then the comparator A3 outputs the high level, and when the comparator A3 outputs the high level, based on the logic configuration, the logic device group outputs the second sampling control signal based on the change of the level of the comparators A1 and A2.

It should be noted that, the circuit structure of the timing circuit module mentioned above is only exemplary, rather than limiting the circuit structure of the timing circuit module in the present application. In fact, based on the design of the timing logic by the technicians, other timing circuit modules including a comparator, a logic device group and a capacitor can also be proposed; or, the timing circuit module containing a clock signal generator and a counter can also be proposed, which are not elaborated herein, however, the timing circuit module designed based on the technical enlightment of the above timing circuit module should be deemed as the specific example of the present application. In addition, the devices in the above timing circuit module can be included in the chip. To facilitate the periods of various ACs provided by different AC input powers, the devices used for timing, such as a capacitor and the peripheral devices or a counter, in the timing circuit module can be assembled outside the chip in which the leakage protection circuit is located, and the devices can be controlled to acquire data through corresponding pins, such that the technicians can select based on the requirements of specific designs. Based on the design of the above timing circuit modules, one example is as follows: the sampling unit included in the leakage protection circuit samples the voltage of the electrical signals from the power supply line during the period in which the second sampling control signal is received.

It should also be noted that, as required by actual logic design, the logic device group mentioned in any of the above examples can contain at least one logic device, and all the logic devices are electrically connected to realize corresponding logic configuration, wherein the logic devices include but are not limited to an AND gate, an OR gate, a NAND gate, a NOT gate, an encoder, a decoder, a selector, etc.

The sampling unit is connected with the detection unit and is configured to sample the electrical signals from the power supply line based on the received sampling control signals.

Please refer to FIG. 8 which is a structural schematic diagram of the leakage protection circuit in one embodiment. As shown in the figure, wherein the sampling unit 12 contains a controlled switch and a sampling resistor, wherein the control terminal of the controlled switch is connected with the output terminal of the detection unit, one access terminal of the controlled switch is connected with the power supply line, while the other access terminal is grounded via the sampling resistor, and the sampling resistor is further connected with the control unit 13. Wherein the controlled switch includes but is not limited to any one of a triode (BJT), a junction field effect transistor (JFET), a depletion MOSFET and thyristor. When the detection unit 11 outputs a sampling control signal, the controlled switch is on, and the control unit 13 acquires the voltage of the sampled electrical signals from the sampling resistor.

In one specific example, as shown in FIG. 8, the controlled switch is an MOSFET as an example, the gate of the MOSFET is connected with the output terminal of the detection unit, while the drain of the MOSFET is connected with the power supply line and the source is connected with the sampling resistor. Wherein based on the detection unit described above, the MOSFET is on when receiving the first sampling control signal or the second sampling control signal, such that the control unit 13 acquires the sampled voltage of the electrical signals from the power supply line.

The control unit is configured to compare the voltage of the sampled electrical signals with the predetermined power-off protection voltage threshold and providing leakage protection based on the compared results.

Herein, the power-off protection voltage threshold predetermined by the control unit can be supplied by a constant voltage circuit. The power-off protection voltage threshold can be designed based on the fact that the value of voltage drop of the sampling unit will be influenced by the division of the AC input power by human bodies. When the control unit determines that the sampled voltage is lower than the power-off protection voltage threshold, the power supply line may be controlled to be in non-conductive state or the leakage protection control signals may be output; otherwise, the power supply line is in conductive state so as to enable the load to operate normally.

In one embodiment, the control unit contains a comparison circuit module, a logic latch circuit module and a switch circuit module, wherein the comparison circuit module is configured to compare the voltage of the sampled electrical signals with the predetermined power-off protection voltage threshold and output the compared results. The logic latch circuit module is connected with the comparison circuit module and is configured to latch the compared results. The switch circuit module is connected with the logic latch circuit module and is configured to control the conductive state or non-conductive state of the power supply line based on the latch signals.

Please refer to FIG. 9 which shows a waveform schematic diagram of the voltage of sampled electrical signals received by the comparison circuit module when voltage division is generated at the AC input power side due to man-made misoperation and when the load is connected to the power supply line normally with no man-made voltage division, corresponding to the leakage protection circuit as shown in FIG. 8. As shown in the figure, when the load is connected to the power supply line with no man-made misoperation, the sampled voltage is higher than the power-off protection voltage threshold Vref; when the load is connected to the power supply line with man-made misoperation, the sampled voltage is lower than the power-off protection voltage threshold Vref due to voltage division by human bodies. When the sampled voltage is higher than the power-off protection voltage threshold Vref, the comparison circuit module outputs a jumping signal, the logic latch circuit module latches the jumping signal and outputs the latch signal to a switch circuit module, and the switch circuit module controls the power supply line to be in conductive state, otherwise, the comparison circuit module does not output a jumping signal, the logic latch circuit module does not output latch signals, and the switch circuit module maintains the non-conductive state of the power supply line, thereby protecting the safety of the load and human.

In a specific example, the comparison circuit module includes a comparator, and the switch circuit module includes the controlled switch and a switch drive module, the negative input terminal of the comparator is accessed to the power-off protection voltage threshold and the positive input terminal of the comparator is connected to the sampling unit to get the voltage of the sampled electrical signals, the output terminal of the comparator is connected to the input terminal of the logic latch circuit, and the output terminal of the logic latch circuit module is connected to the switch drive module. The switch circuit module includes a gate drive module and an MOSFET as an example, the gate of the MOSFET is connected with the output terminal of the logic latch circuit through the gate drive module, and the source and the drain are connected with the two ends of the power supply line, that is, the MOSFET is a necessary part of the power supply line, the current flow through the MOSFET. When there is no voltage division is generated at the AC input power side, the comparator always outputs the high level, and the MOSFET is turned on and the power supply line is in conductive state such that the load works normally. In another embodiment, the gate of the MOSFET is connected with the output terminal of the comparator through the gate drive module and the like. Please refer to FIG. 10 which is a structural schematic diagram of the leakage protection circuit in another embodiment, wherein the logic latch circuit module latches a high level state when the comparison circuit module outputs the jump signal from a low level to a high level, and latches a low level state when the comparison circuit module outputs the jump signal from a high level to a low level. In the initial period, the logic latch circuit module is in a low level state, and the switch circuit module cuts off the power supply line based on the received latch signals in a low level state; and when the comparison circuit module outputs the jump signal from a low level to a high level, the logic latch circuit module latches the high level state and outputs the latch signals in a high level state, then the switch circuit module is on such that the power supply line is in conductive state. Therefore, it can be seen that the latch signal is representing the leakage protection control signal generated by the leakage protection circuit.

Herein, the MOSFET in the controlled switch can also be substituted into any one of a triode (BJT), a junction field effect transistor (JFET), a depletion MOSFET and a thyristor. The switch drive module is not necessarily a gate drive module, but can be adjusted based on the actual design requirements. For example, the switch circuit module includes an MOSFET and a source drive module, etc.

In some other embodiments, the output terminal of the logic latch circuit module is connected with the other circuits (such as the drive circuit described above) connected with the power supply line, such that the other circuits provide corresponding leakage protection based on the latch signals, and this will not be repeated redundantly herein.

It should be noted that, the comparative relationship between the voltage of the sampled electrical signal with voltage division by human bodies and the power-off protection voltage threshold and the comparative relationship between the sampled electrical signal voltage with no voltage division by human bodies and the power-off protection voltage threshold as shown in the above FIG. 9 are related to the circuit structure of the sampling unit. When the circuit structure of the sampling unit is configured in such a way that the voltage of the sampled electrical signals with voltage division by human bodies is higher than the voltage of the sampled electrical signals with no voltage division by human bodies, the corresponding control unit should provide corresponding leakage protection based on the compared results contrary to those shown in FIG. 9. Wherein the circuit structure of the sampling unit can also be of a connection manner in which one access terminal of the controlled switch is connected to the power supply line via a sampling resistor while the other access terminal of the controlled switch is grounded, and the connection manners will not be enumerated herein.

In order to prevent the logic latch circuit module from providing wrong latch signals in the restarting operation after users turn off the electrical appliance, when the power supply for the load is interrupted, the logic latch circuit module needs to reset to the initial low level state. In some specific examples, the logic latch circuit module resets based on the fact that the leakage protection circuit is in an undervoltage state.

Wherein the undervoltage state is a state in which the voltage of the load cannot reach its normal working voltage due to the influence of external factors or electrical appliance components connected with or located on the power supply line in the normal operating period of the load, such that the load is in a state of not operating. The undervoltage state of the leakage protection circuit is caused by man-made power failure or by abnormity of the electrical appliance components inside (or outside) the leakage protection circuit. For example, the instances enabling the leakage protection circuit to be in an undervoltage state include but are not limited to the power-off state of the leakage protection circuit in the power off period and the state of the leakage protection circuit when the power supply system cannot provide corresponding operating voltage to the active device in the leakage protection circuit.

The logic circuit module can reset the latched signals through detecting the undervoltage state of the leakage protection circuit. In one specific example, the reset terminal of the logic latch circuit module is connected with a power supply line, when the power supply of the power supply line is interrupted, the leakage protection circuit is in an undervoltage state, and the reset terminal of the logic circuit module receives effective reset signals. In another specific example, the reset terminal of the logic latch circuit module is connected with the undervoltage protection circuit used for protecting the leakage protection circuit, and when the undervoltage protection circuit generates undervoltage protection signals due to the detection of an undervoltage state of the leakage protection circuit, the reset terminal of the logic latch circuit module takes the undervoltage protection signal as the effective reset signal, thereby realizing the reset operation of the logic latch circuit module.

In addition, due to the logic latch circuit module, when the power supply line is in conductive state, the detection unit and the sampling unit are not necessarily required to continuously provide voltage of the electrical signals to continuously control the on or off state of the switch circuit unit. Therefore, the sampling of the power supply line at intervals is stopped when the power supply line is controlled to be conductive. Wherein the leakage protection circuit can add a control circuit module in the detection unit or a sampling unit to correspondingly stop the detection or sampling. In some specific examples, the control unit is also connected with the detection unit, and is configured to control the detection unit to stop outputting the sampling control signals while control the power supply line to be conductive. For example, the timing circuit module in the detection unit is further connected with the output terminal of the logic latch circuit module in the control unit, and when the logic latch circuit module outputs the latch signals in a high level state, the timing circuit module does not output the first sampling control signal or the second sampling control signal, thereby effectively preventing such problems as mis-power-off of the load caused by unstable voltage of the AC input power.

When the power supply line is in conductive state, the drive circuit in the drive device provides constant-current power supply to the load based on the current rectified by the rectifying circuit. Herein, one end of the drive circuit is connected on the intersecting point between the leakage protection circuit and the rectifying circuit, performs constant-voltage processing on the received power supply to provide constant-current output to the load, and returns to the grounded part controlled by the leakage protection circuit via the load, thereby realizing a complete loop of the power supply line.

In some embodiments, the drive circuit utilizes the resonance principle to process the rectified current into operating power supply of the load. Herein, the drive circuit includes an LC oscillating unit and a switch control unit controlling the LC oscillating unit. The switch control unit is used to perform the switch control on the conductive or non-conductive state of the oscillating loop in the LC oscillating unit so as to provide a constant-current power supply to the load.

In other embodiments, the drive circuit provides constant-current power supply to the load. Herein, the drive circuit contains a line voltage compensation circuit. The line voltage compensation circuit performs reversed linear compensation on the rectified current through the at least one predetermined linear compensation relationship, such that the current flowing through the load is compensated, and constant-current power supply is realized.

It should be noted that, the above drive mode and circuit structure of the drive circuit are merely exemplary, rather than limiting the present application. Aiming at the load of actually being driven, the technicians can provide corresponding drive circuit during use, which will not be enumerated herein. However, any manner in which the drive circuit is connected with the leakage protection circuit and the rectifying circuit and the load is supplied with constant-current power supply should be deemed as a specific example of the present application.

Figure 13:
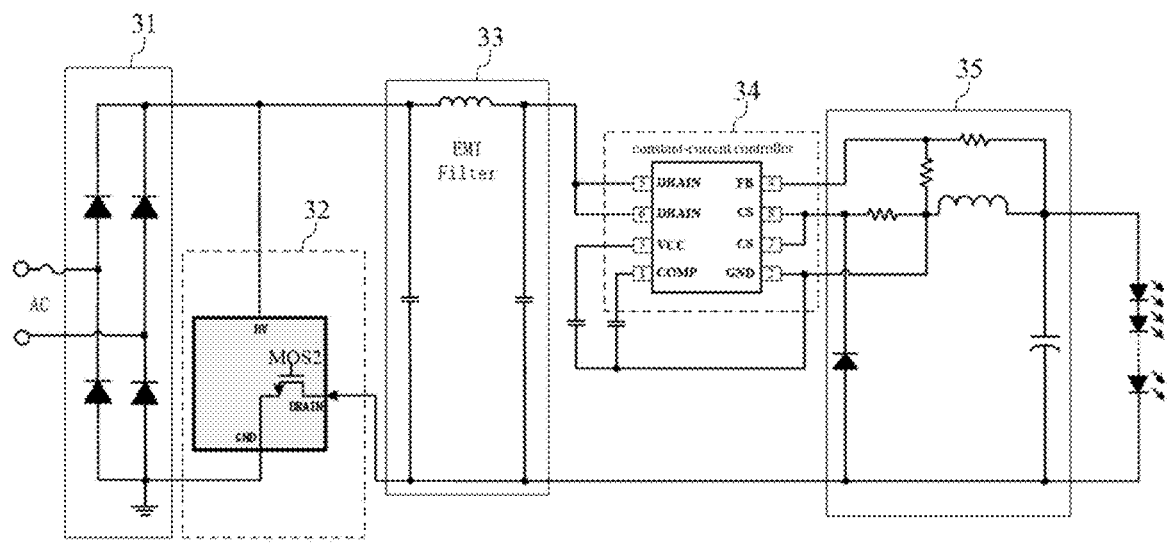
FIG. 13 is a structural schematic diagram of the circuit of the drive device in the present application in one embodiment.

It should also be noted that, all or part of the electrical appliances in the above drive circuit can be integrated in the chip, and can be connected with the leakage protection circuit, the rectifying circuit, the load and other peripheral circuits via the pins. Wherein the peripheral circuits include but are not limited to the electrical appliances not integrated in the drive circuit, and the power supply line in the chip, etc. For example, the switch control unit in the drive circuit is integrated in the constant-current controller which is the product of our company, the DRAIN pin of the series of chips can be used for being accessed to the connecting node of the leakage protection circuit and the rectifying circuit, the GND pin is used for connecting the switch circuit module in the leakage protection circuit, and the CS pin is connected with the LC oscillating unit. Please refer to FIG. 13 which is a structural schematic diagram of a drive device in one embodiment, wherein the output terminal of the rectifying circuit 31 serves as an initiating terminal of the power supply line of the load and is connected with the HV pin of the chip 32 containing the leakage protection circuit, the electromagnetic interference (EMI) circuit 33 in the drive device is configured to reduce the electromagnetic interference on the power supply line, the DRAIN pin of the constant-current controller 34 in the drive circuit is accessed to the power supply line through connecting with the EMI circuit, wherein the constant-current controller 34 controls the conductive or non-conductive state of the DRAIN pin and the GND pin via the electrical signals sampled by the CS and FB pins, and further controls the post-stage LC oscillating unit 35 so as to supply constant-current power supply to the LED load. The ground pin of the constant-current controller 34 and the grounded end of the LC oscillating unit 35 are both connected with the DRAIN pin of the chip 32, and is grounded via the GND pin of the chip 32, thereby realizing the control of the conductive or non-conductive state of the whole power supply line by the leakage protection circuit in the chip 32.

In addition, all or part of the circuits in the leakage protection circuit and the drive circuit in the drive device can be integrated in a drive chip. The drive chip is connected with the rectifying circuit, electrical appliances which are not integrated in the, the leakage protection circuit and the drive circuit, and other peripheral circuits via the pin. The drive chip is configured to perform leakage detection on the current rectified by the rectifying circuit and drive the adaptive load, so as to supply users with leakage protection and provide constant-current power supply to the load, wherein the peripheral circuit includes the power supply line of the chip as an example.

In one example, the drive chip contains the following pins: HV, GND, DRAIN, CS and VCC, etc. Wherein the HV pin serves as a current input terminal of the drive chip and is connected to the power supply line which is connected with the output terminal of the rectifying circuit, the DRAIN and GND pins connects the drive chip to the ground wire loop of the power supply line, such that the conductive or non-conductive state of the ground wire loop of the power supply line is controlled by the drive chip. The leakage protection circuit in the drive chip samples the power supply line at intervals through detecting the HV pin, detects the voltage of the sampled electrical signals so as to determine whether the voltage of the AC input power is divided or not, and controls the conductive or non-conductive state of the circuit between the DRAIN and GND pins based on the determined results, thereby realizing leakage protection. When the DRAIN and GND pins in the drive chip are in conductive state, the drive circuit in the drive chip samples the rectified electrical signals through the CS port and supplies a constant current to the load based on the detection of the sampled electrical signals. In addition, the VCC pin can be used for being accessed to the constant-voltage source of the chip, so as to supply a power source to the active devices in the chip, and supply a constant reference voltage for electrical appliances such as a comparator and an operational amplifier in the chip.

Figure 16:
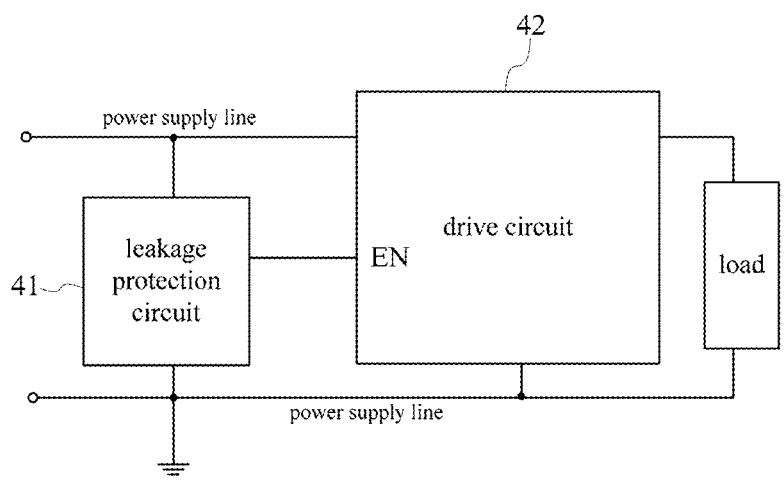
FIG. 16 is a structural schematic diagram of the leakage protection circuit and the drive circuit.
Figure 17:
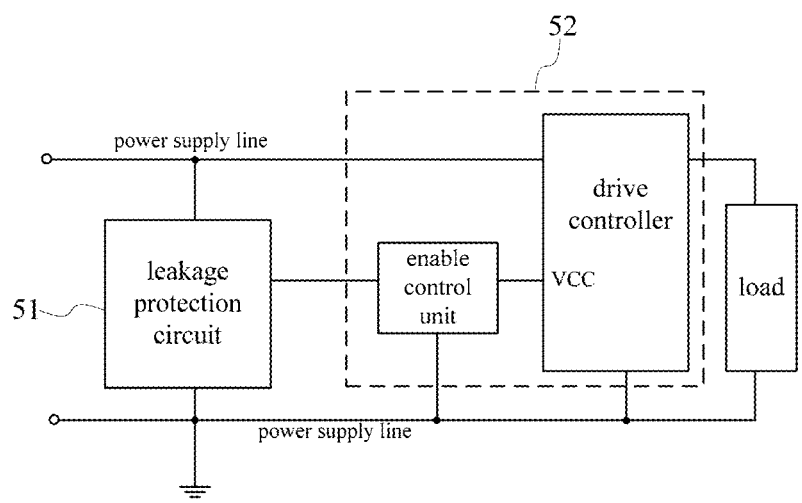
FIG. 17 is another structural schematic diagram of the leakage protection circuit and the drive circuit.

In another example, based on the actual design requirements of the peripheral circuit of the chip and other circuits in the drive device in which the chip is located, the chip can further include a pin used for outputting the leakage protection control signal. Wherein the leakage protection control signal is generated and output when the leakage protection circuit confirms electric leakage through sampling at intervals and voltage division detection. Through the pin used for outputting the leakage protection control signal, other circuits connected with the power supply line can give corresponding leakage protection response based on the received leakage protection control signals. Wherein the other circuits include but are not limited to a filter circuit and a drive circuit, etc. For example, as shown in FIG. 16, the drive circuit includes an enable control unit (not shown in the figure), the controlled terminal (namely, the enable terminal EN) is connected with the output terminal of the leakage protection circuit and the enable control unit drives the switch device or the logic device in the drive circuit, the enable control unit controls the switch device in the drive circuit to be non-conductive when receiving the leakage protection control signal, such that the energy converted by the drive circuit can not be provided to the load until the leakage protection control signal is invalid, and the switch device is switched into a conductive state, at this time, the drive circuit can execute the drive operation. For another example, as shown in FIG. 17, the drive chip contains an enable control unit and an existing circuit in the constant-current controller, the controlled terminal of the enable control unit is connected with the output terminal of the leakage protection circuit, the input terminal is connected with the power supply terminal of the drive chip, and the output terminal is grounded; and when the leakage protection circuit outputs the leakage protection control signal, the enable control unit gives corresponding leakage protection response based on the leakage protection control signal, that is, make the power supply terminal VCC of the constant-current controller be grounded, such that the active device in the circuit in existing constant-current controller cannot reach its normal operating voltage.

It should be noted that, the above existing constant-current controller is merely exemplary, rather than limiting the present application. By means of the enlightenment of the above connection relationship between the enable control unit and the chip, those skilled in the art can add corresponding enable control unit to the other drive chips which are not equipped with leakage protection, such that the leakage protection can be realized by combining the leakage protection circuit and the drive circuit.

It should be noted that, the quantity of pins of the drive chip is related to the integrated circuit module, for example, some capacitor devices in the drive circuit are not integrated in the drive chip, then corresponding drive chip provides pins used for connecting corresponding capacitor devices.

Figure 14:
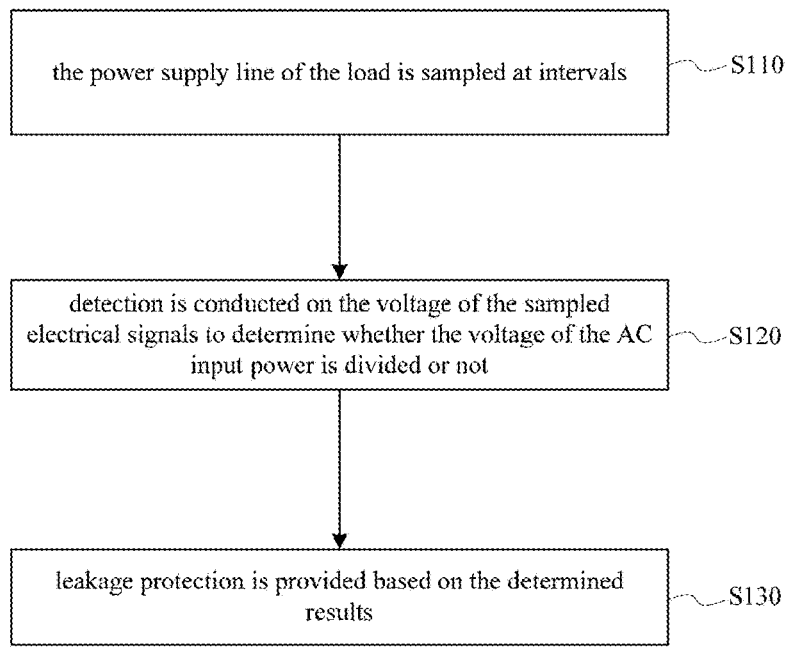
FIG. 14 is a flow chart of the leakage protection method in the present application in one embodiment.

Please refer to FIG. 14 which is a flow chart of the leakage protection method. The leakage protection method can be executed by the above leakage protection circuit, or other leakage protection circuits capable of executing the method.

In step S110, the power supply line of the load is sampled at intervals.

Herein, the sampling interval can be set based on the voltage change period of the power supply line. For example, the electrical signals can be sampled at the voltage peak or the valley in each rectified voltage change period or in at least every rectified voltage change period, or the electrical signals can be sampled in the fixed voltage area between the voltage peak and the valley in each rectified voltage change period or in at least every rectified voltage change period. Wherein in order to ensure that human bodies will not be damaged by continuous electric shock during unintended touch period, the sampling interval is a millisecond or even a microsecond, for example, the sampling interval may be every half of a voltage change period, every one voltage change period or every multiple voltage change periods. The sampling interval can be realized through the circuit structure which is designed by utilizing the voltage change period in the leakage protection circuit. Or, the sampling interval is set according to the predetermined duration. For example, the leakage protection circuit contains a capacitor and a resistor, and the sampling interval is determined based on the charging duration of the capacitor; wherein the technicians can design corresponding sampling intervals through assembling a resistor. The resistor can be an adjustable resistor or a fixed resistor.

In some embodiments, the electric signal voltage can be sampled based on the sampling interval set according to the voltage change period, and the electric signal voltage can be compared with the predetermined power-off protection voltage threshold to determine whether the voltage of the AC input power is divided or not.

To this end, step S110 can contain a step of acquiring the sampled electrical signals from the power supply line based on the detection of the voltage of the power supply line and based on the results of limited voltage detection.

Herein, the leakage protection circuit can detect the change of the voltage of the power supply line in real time, and determine to reach the sampling interval when detecting that the voltage changes to the predetermined reference voltage value and acquire the sampled electrical signals from the power supply line. Wherein the predetermined reference voltage value can also be equal to any voltage value correspond to the voltage change period, such as the peak value, the valley value and the intermediate value.

In some embodiments, the leakage protection circuit can detect the voltage of the power supply line, and acquire the sampled electrical signals from the power supply line when the detected voltage falls within the predetermined limited voltage range, wherein the limited voltage range is intercepted in the voltage change range of the power supply line, for example, the limited voltage range is [V1,V2], wherein $0 \leq V1 < V2 < Vmax$, and Vmax is the maximum value in the voltage change range. Wherein the leakage protection circuit will execute one sampling in each voltage change period.

In some other embodiments, the leakage protection circuit acquires the sampled electrical signals from the power supply line within a time limit when the detected voltage falls within the predetermined limited voltage range. Wherein the limited sampling duration is shorter than the duration in which the detected voltage falls within the predetermined limited voltage range. The limit of the sampling duration can effectively prevent mis-connectivity operations caused by jittering of the sampled electrical signals. For example, with reference to FIG. 4 which is a timing sequence schematic diagram of the limited voltage detection circuit module and the timing circuit module represented by respectively utilizing the waveforms of the first sampling control signal and the second sampling control signal, the leakage protection circuit samples the electrical signals from the power supply line in the effective time limit of the second sampling control signal. Wherein the first sampling control signal is generated when the voltage of the power supply line is detected to fall within the predetermined limited voltage range, and the second sampling control signal is generated from the first sampling control signal, and the second sampling control signal is effective within a time limit. The leakage protection circuit samples the electrical signals based on the second sampling control signals.

In some embodiments, the leakage protection circuit is configured to acquire the sampled electrical signals from the power supply line after a predetermined detection timing is exceeded and the voltage of the power supply line falls within a predetermined limited voltage range. Please refer to FIG. 6 which is a waveform schematic diagram of the relationship between the first sampling control signal and the second sampling control signal in the leakage protection circuit. As shown in the figure, wherein the detection timing can enable that, within at least in one time interval T2 of first sampling control signal, the timing circuit module does not output the second sampling control signal based on the first sampling control signal. Therefore, the existence duration of the detection timing is the minimum time interval of the second sample control signal, and the timing circuit module can output the second sampling control signal in the case that the detection timing is exceeded and the first sampling control signal is effective, that is, the timing circuit module can output the second sampling control signal based on the first sample control signal only if the minimum time interval is satisfied. Further, the sampling interval may be set based on the change period of the voltage of the power supply line or based on a predetermined duration, the minimum time interval also may be set based on the change period of the voltage of the power supply line or based on a predetermined duration. The leakage protection circuit acquires the sampled electrical signals from the power supply line within the duration time limit of the second sampled control signal.

Based on the technical concept mentioned above, the timing circuit module may further set a sampling interval T3, during which the limited voltage detection circuit module detects a voltage of the power supply line and outputs a first sampling control signal when the detected voltage falls within a predetermined limited voltage range. For example, the timing circuit module is configured to start the sampling interval T3 after T2 is exceeded, instruct the limited voltage detection circuit module to detect the voltage of the power supply line within T3, and output a first sampling control signal when the detected voltage falls within a predetermined limited voltage range. The timing circuit module is configured to output a second sampling control signal based on the received first sampling control signal, and start the time T2 and perform loop operation.

In step S120, detection is conducted on the voltage of the sampled electrical signals to determine whether the voltage of the AC input power is divided or not.

Herein, in the leakage protection circuit, the sampled voltage corresponding to the sampling instant can be compared with the predetermined reference voltage corresponding to the sampling instant to determine whether the voltage of the AC input power is divided or not, so as to determine the conductive or non-conductive state of the power supply line connected to the load. For example, when detecting the voltage of the power supply line is zero, the leakage protection circuit starts the timing of the sampling interval, samples the electrical signals from the power supply line when timing reaches, determines the voltage threshold when timing reaches based on the voltage change period of the power supply line, and compares the voltage of the sampled electrical signals with the voltage threshold to determine whether the voltage of the AC input power is divided or not.

In some embodiments, the power-off protection voltage threshold is predetermined by the leakage protection circuit. The power-off protection voltage threshold can be designed based on the fact that the value of voltage drop of the sampling unit will be influenced by the division of the AC input power by human bodies. The leakage protection circuit compares the voltage of the sampled electrical signals with the predetermined power-off protection voltage threshold and outputs the compared results. For example, when the load is connected to the power supply line normally, the sampled voltage is higher than the power-off protection voltage threshold; when the load is connected to the power supply line with man-made misoperation, the sampled voltage is lower than the power-off protection voltage threshold due to the voltage division by human bodies.

It should be noted that, based on the circuit structure design of the sampling unit, when the load is connected to the power supply line normally, the sampled voltage is lower than the power-off voltage threshold; when the load is connected to the power supply line with man-made misoperation, the sampled voltage is higher than the power-off protection voltage threshold due to voltage division by human bodies.

In step S130, leakage protection is provided based on the determined results.

In some embodiments, the leakage protection circuit compares the voltage of the sampled electrical signals with the predetermined power-off protection voltage threshold; when the compared result is that the voltage of the AC input power is not divided, the power supply line is controlled to be conductive; and when the detection result is that the voltage of the AC input power is divided, the power supply line is controlled to be non-conductive.

In a specific example, the leakage protection circuit contains a controlled switch connected onto the power supply line. The controlled switch is an MOSFET as an example, when the voltage of the electric signals is higher than or equal to the power-off protection voltage threshold, the leakage protection circuit controls the MOSFET to be turned on, otherwise, the leakage protection circuit controls the MOSFET to be turned off.

In some other embodiments, the leakage protection circuit can output the leakage protection control signals to other circuits connected with the power supply line based on the determined results. Wherein the leakage protection control signal is generated and output when the leakage protection circuit confirms electric leakage through sampling at intervals and voltage division detection. Other circuits connected with the power supply line can give corresponding leakage protection response based on the received leakage protection control signals. Wherein the other circuits include but are not limited to a filter circuit and a drive circuit, etc. For example, the drive circuit connected with the leakage protection circuit includes an enable control unit (not shown in the figure), the controlled terminal (namely, the enable terminal EN) is connected with the output terminal of the leakage protection circuit and the enable control unit controls the switch device or the logic device in the drive circuit, the enable control unit controls the switch device in the drive circuit to be non-conductive when receiving the leakage protection control signal, such that the energy converted by the drive circuit can not be provided to the load until the leakage protection control signal is invalid, and the switch device is switched into a conductive state, at this time, the drive circuit can execute the drive operation. For another example, the drive circuit connected with the leakage protection circuit contains an enable control unit and an existing constant-current controller, the controlled terminal of the enable control unit is connected with the output terminal of the leakage protection circuit, the input terminal is connected with the power supply terminal of the drive chip, and the output terminal is grounded; and when the leakage protection circuit outputs the leakage protection control signal, the enable control unit gives corresponding leakage protection response based on the leakage protection control signal, that is, make the power supply terminal VCC of the constant-current controller be grounded, such that the active device in existing constant-current controller cannot reach its normal operating voltage.

In another embodiment, the leakage protection method further includes a step of stopping sampling the power supply line at intervals when the power supply line is controlled to be conductive.

As when the power supply line is in conductive state, the leakage protection circuit is not necessarily required to sample the voltage of the electrical signals continuously at intervals to continuously control the conductive of the switch circuit unit. Therefore, the leakage protection circuit can correspondingly stop generating the sampling control signals or stop sampling when the power supply line is in conductive state.

It should be noted that, the above steps can be executed by the corresponding circuit module of the leakage protection circuit mentioned in the present application, and the structure of the leakage protection circuit will not be repeated redundantly herein.

Figure 15:
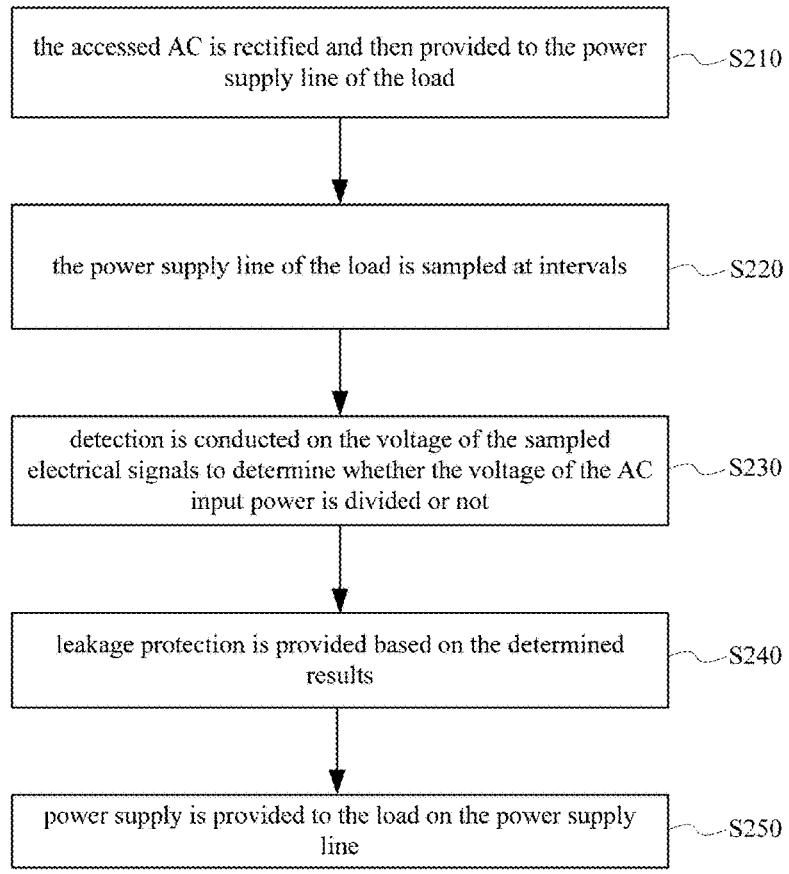
FIG. 15 is a flow chart of the drive method in the present application in one embodiment.

Please refer to FIG. 15 which is a flow chart of the drive method in one embodiment of the present application. The drive method is mainly executed by the above drive device, or by the other drive devices which can execute the method.

In step S210, the accessed AC is rectified and then provided to the power supply line of the load.

Herein, the drive device is accessed to the AC input power and is rectified and output via the rectifier bridge constituted by four diodes.

In step S220, the power supply line is sampled at intervals. Wherein the implementation of step S220 may be the same as or similar to the implementation of step S110, and will not be described in detail herein.

For example, the leakage protection circuit in the drive device is configured to acquire the sampled electrical signals from the power supply line after a predetermined detection timing is exceeded and the voltage of the power supply line falls within a predetermined limited voltage range. Please refer to FIG. 6 which is a waveform schematic diagram of the relationship between the first sampling control signal and the second sampling control signal in the leakage protection circuit. As shown in the figure, wherein the detection timing can enable that, within at least in one time interval T2 of first sampling control signal, the timing circuit module does not output the second sampling control signal based on the first sampling control signal. Therefore, the existence duration of the detection timing is the minimum time interval of the second sample control signal, and the timing circuit module can output the second sampling control signal in the case that the detection timing is exceeded and the first sampling control signal is effective, that is, the timing circuit module can output the second sampling control signal based on the first sample control signal only if the minimum time interval is satisfied. Further, the sampling interval may be set based on the change period of the voltage of the power supply line or based on a predetermined duration, the minimum time interval also may be set based on the change period of the voltage of the power supply line or based on a predetermined duration. Wherein the first sampling control signal is generated when the voltage of the power supply line is detected to fall within the predetermined limited voltage range, and the second sampling control signal is generated from the first sampling control signal, and the second sampling control signal is effective within a time limit. The leakage protection circuit acquires the sampled electrical signals from the power supply line within the duration time limit of the second sampled control signal.

Based on the technical concept mentioned above, the timing circuit module may further set a sampling interval T3, during which the limited voltage detection circuit module detects a voltage of the power supply line and outputs a first sampling control signal when the detected voltage falls within a predetermined limited voltage range. For example, the timing circuit module is configured to start the sampling interval T3 after T2 is exceeded, instruct the limited voltage detection circuit module to detect the voltage of the power supply line within T3, and output a first sampling control signal when the detected voltage falls within a predetermined limited voltage range. The timing circuit module is configured to output a second sampling control signal based on the received first sampling control signal, and start the time T2 and perform loop operation.

In step S230, detection is conducted on the voltage of the sampled electrical signals to determine whether the voltage of the AC input power is divided or not. Wherein the implementation of step S230 may be the same as or similar to the implementation of step S120, and will not be described in detail herein.

For example, the power-off protection voltage threshold is predetermined by the leakage protection circuit in the drive device. The power-off protection voltage threshold can be designed based on the fact that the value of voltage drop of the sampling unit will be influenced by the division of the AC input power by human bodies. The leakage protection circuit compares the voltage of the sampled electrical signals with the predetermined power-off protection voltage threshold and outputs the compared results. For example, when the load is connected to the power supply line normally, the sampled voltage is higher than the power-off protection voltage threshold; when the load is connected to the power supply line with man-made misoperation, the sampled voltage is lower than the power-off protection voltage threshold due to the voltage division by human bodies.

In step 240, leakage protection is provided based on the determined results. Wherein the implementation of step S240 may be the same as or similar to the implementation of step S130, and will not be described in detail herein.

For example, the leakage protection circuit in the drive device contains a controlled switch connected onto the power supply line. The controlled switch is an MOSFET as an example, when the voltage of the electric signals is higher than or equal to the power-off protection voltage threshold, the leakage protection circuit controls the MOSFET to be turned on and step S250 is executed, otherwise, the leakage protection circuit controls the MOSFET to be turned off to provide leakage protection.

In step S250, power supply is provided to the load on the power supply line.

For example, the drive circuit in the drive device utilizes the resonance principle to process the rectified current into operating power supply of the load. For another example, the drive circuit in the drive device utilizes line voltage compensation method to process the rectified current into operating power supply of the load.

In conclusion, the technical solution in the present application can prevent human from electric shock through sampling the electric signals from the power supply line at intervals and performing voltage detection and comparison to determine whether the voltage of the accessed AC input power is divided, when the voltage of the accessed AC input power is determined to be divided, the power supply line will be controlled in non-conductive state.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A leakage protection circuit in a drive device for a LED tube lamp, comprising:
    a detection module, connected with a power supply line that is rectified from an AC input power and connected in parallel with a circuit loop in which the LED tube lamp is disposed, the detection module comprising a detection unit and a sampling unit connected with the detection unit, wherein the detection unit comprises a limited voltage detection circuit module outputting a first sampling control signal to the sampling unit which detects an electrical signal from the power supply line based on the received first sampling control signal, and wherein the limited voltage detection circuit module intermittently detects a voltage of the power supply line when the voltage of the power supply line transcends a predetermined threshold and outputs the first sampling control signal when the detected voltage of the power supply line falls within a predetermined limited voltage range; and
    a control unit, coupled with the detection module and configured to control the circuit loop to be when the first sampling control signal indicating that a human body is connected with a detection loop in which the detection module is disposed.

2. The leakage protection circuit of claim 1, wherein the detection unit further comprises a timing circuit module which is connected with the limited voltage detection circuit module and configured to intermittently output the sampling control signal based on the first sampling control signal.

3. The leakage protection circuit of claim 2, wherein the timing circuit module is configured to intermittently output the sampling control signal with a default period.

4. The leakage protection circuit of claim 1, wherein the voltage of the power supply line is detected at an interval of multiple cycles of waveform of the power supply line.

5. The leakage protection circuit of claim 1, wherein the control unit comprises a comparison circuit module, which is connected with the sampling unit and configured to compare the voltage of the sampled electrical signal with the predetermined threshold to determine whether to output a compared result.

6. The leakage protection circuit of claim 5, wherein the comparison circuit module outputs a control signal when the sampled electrical signal is higher than the predetermined threshold.

7. The leakage protection circuit of claim 5, wherein the control unit further comprises a logic latch circuit module, connected with the comparison circuit module and configured to latch the compared result and output a corresponding latch signal.

8. The leakage protection circuit of claim 7, wherein the control unit further comprises a switch circuit module which is connected in the circuit loop and controlled by the logic latch circuit module and configured to determine whether to close the circuit loop according to the latch signal.

9. A drive device, comprising:
    a rectifying circuit, configured to rectify an AC input power to output a rectified voltage to a power supply line;
    a protection circuit, comprising:
    a detection module, connected with the power supply line and connected in parallel with a circuit loop in which the LED tube lamp is disposed, the detection module comprising a detection unit and a sampling unit connected with the detection unit, wherein the detection unit comprises a limited voltage detection circuit module outputting a first sampling control signal to the sampling unit which detects an electrical signal from the power supply line based on the received first sampling control signal, and wherein the limited voltage detection circuit module intermittently detects a voltage of the power supply line when the voltage of the power supply line transcends a predetermined threshold and outputs the first sampling control signal when the detected voltage of the power supply line falls within a predetermined limited voltage range; and a control unit, coupled with the detection module, and configured to control the circuit loop to be when the first sampling control signal indicating that a human body is connected with a detection loop in which the detection module is disposed; and a drive circuit, connected with the protection circuit and configured to supply power to a load based on a current rectified by the rectifying circuit.

10. The drive device of claim 9, wherein the detection unit further comprises a timing circuit module which is connected with the limited voltage detection circuit module and configured to intermittently output the sampling control signal based on the first sampling control signal.

11. The drive device of claim 10, wherein the timing circuit module is configured to intermittently output the sampling control signal with a default period.

12. The drive device of claim 9, wherein the voltage of the power supply line is periodically detected at an interval of multiple cycles of waveform of the power supply line voltage.

13. The drive device of claim 9, wherein the control unit comprises a comparison circuit module, which is connected with the sampling unit and configured to compare the voltage of the sampled electrical signal with the predetermined threshold to decide whether to output a compared result.

14. The drive device of claim 13, wherein the comparison circuit module outputs a control signal when the sampled electrical signal is higher than the predetermined threshold.

15. The drive device of claim 14, wherein the control unit further comprises a logic latch circuit module, connected with the comparison circuit module and configured to latch the compared result and output a corresponding latch signal.

16. The drive device of claim 15, wherein the control unit further comprises a switch circuit module which is connected in the circuit loop and controlled by the logic latch circuit module and configured to determine whether to close the circuit loop according to the latch signal.

* * * * *